US008284183B2

(12) United States Patent
Yamamoto et al.

(10) Patent No.: US 8,284,183 B2
(45) Date of Patent: Oct. 9, 2012

(54) INVERTER CIRCUIT AND DISPLAY DEVICE

(75) Inventors: Tetsuro Yamamoto, Kanagawa (JP); Katsuhide Uchino, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/064,220

(22) Filed: Mar. 11, 2011

(65) Prior Publication Data

US 2011/0242069 A1 Oct. 6, 2011

(30) Foreign Application Priority Data

Apr. 1, 2010 (JP) ................................ 2010-085492

(51) Int. Cl.
*G09G 5/00* (2006.01)
*H03K 19/094* (2006.01)

(52) U.S. Cl. ....................................... 345/211; 326/112

(58) Field of Classification Search ........................ None
See application file for complete search history.

(56) References Cited

U.S. PATENT DOCUMENTS 5,444,273 A * 8/1995 Ueno ............................ 257/138
6,194,915 B1 * 2/2001 Nakayama et al. ........... 326/121
7,277,071 B2 * 10/2007 Oh ................................. 345/76
8,040,297 B2 * 10/2011 Chung ............................ 345/76
2007/0091029 A1 * 4/2007 Uchino et al. .................. 345/76
2009/0121984 A1 * 5/2009 Yamamoto et al. ............. 345/76

FOREIGN PATENT DOCUMENTS

JP 2008-083272 4/2008

* cited by examiner

*Primary Examiner* — Shawki S Ismail
*Assistant Examiner* — Crystal L Hammond
(74) *Attorney, Agent, or Firm* — Rader Fishman & Grauer, PLLC

(57) ABSTRACT

An inverter circuit including: first to third transistors; first and second switches; and a first capacitive element. The first and second transistors are connected in series between a first voltage line and a second voltage line. The third transistor is connected between the second voltage line and a gate of the second transistor. The first and second switches are connected in series between a voltage supply line and a gate of the third transistor, and are turned on/off alternately to prevent the first and second switches from simultaneously turning ON. One end of the first capacitive element is connected to a node between the first and second switches. Off-state of the first transistor allows a predetermined fixed voltage to be supplied from the voltage supply line to the gate of the second transistor, via the first switch, the one end of the first capacitive element and the second switch.

13 Claims, 14 Drawing Sheets

INVERTER CIRCUIT AND DISPLAY DEVICE

BACKGROUND OF THE INVENTION

1. Field of the Invention

The present invention relates to an inverter circuit that is suitably applicable to, for example, a display device using an organic EL (Electro Luminescence) element. The present invention also relates to a display device provided with the above-mentioned inverter circuit.

2. Description of the Related Art

In recent years, in the field of display devices that display images, a display device that uses, as a light emitting element for a pixel, an optical element of current-driven type whose light emission luminance changes according to the value of a flowing current, e.g. an organic EL element, has been developed, and its commercialization is proceeding. In contrast to a liquid crystal device and the like, the organic EL element is a self-luminous element. Therefore, in the display device using the organic EL element (organic EL display device), gradation of coloring is achieved by controlling the value of a current flowing in the organic EL element.

As a drive system in the organic EL display device, like a liquid crystal display, there are a simple (passive) matrix system and an active matrix system. The former is simple in structure, but has, for example, such a disadvantage that it is difficult to realize a large and high-resolution display device. Therefore, currently, development of the active matrix system is brisk. In this system, the current flowing in a light emitting element arranged for each pixel is controlled by a drive transistor.

In the above-mentioned drive transistor, there is a case in which a threshold voltage $V_{th}$ or a mobility μ changes over time, or varies from pixel to pixel due to variations in production process. When the threshold voltage $V_{th}$ or the mobility μ varies from pixel to pixel, the value of the current flowing in the drive transistor varies from pixel to pixel and therefore, even when the same voltage is applied to the gate of the drive transistor, the light emission luminance of the organic EL element varies and uniformity of a screen is impaired. Thus, there has been developed a display device in which a correction function to address a change in the threshold voltage $V_{th}$ or the mobility μ is incorporated (see, for example, Japanese Unexamined Patent Application Publication No. 2008-083272).

A correction to address the change in the threshold voltage $V_{th}$ or the mobility μ is performed by a pixel circuit provided for each pixel. As illustrated in, for example, FIG. 16, this pixel circuit includes: a drive transistor $Tr_{100}$ that controls a current flowing in an organic EL element 111, a write transistor $Tr_{200}$ that writes a voltage of a signal line DTL into the drive transistor $Tr_{100}$, and a retention capacitor $C_s$, and therefore, the pixel circuit has a 2Tr1C circuit configuration. The drive transistor $Tr_{100}$ and the write transistor $Tr_{200}$ are each formed by, for example, an n-channel MOS Thin Film Transistor (TFT).

FIG. 15 illustrates an example of the waveform of a voltage applied to the pixel circuit and an example of a change in each of the gate voltage $V_g$ and the source voltage $V_s$ of the drive transistor $Tr_{100}$. In Part (A) of FIG. 15, there is illustrated a state in which a signal voltage $V_{sig}$ and an offset voltage $V_{ofs}$ are applied to the signal line DTL. In Part (B) of FIG. 15, there is illustrated a state in which a voltage $V_{dd}$ for turning on the write transistor $Tr_{200}$ and a voltage $V_{ss}$ for turning off the write transistor $Tr_{200}$ are applied to a write line WSL. In Part (C) of FIG. 15, there is illustrated a state in which a high voltage $V_{ccH}$ and a low voltage $V_{ccL}$ are applied to a power-source line PSL. Further, in Part (D) and (E) of FIG. 15, there is illustrated a state in which the gate voltage $V_g$ and the source voltage $V_s$ of the drive transistor $Tr_{100}$ change over time in response to the application of the voltages to the power-source line PSL, the signal line DTL and the write line WSL.

From FIG. 15, it is found that a WS pulse P is applied to the write line WSL twice within 1 H, a threshold correction is performed by the first WS pulse P, and a mobility correction and signal writing are performed by the second WS pulse P. In other words, in FIG. 15, the WS pulse P is used for not only the signal writing but also the threshold correction and the mobility correction of the drive transistor $Tr_{100}$.

SUMMARY OF THE INVENTION

Incidentally, in the display device employing the active matrix system, each of a horizontal drive circuit (not illustrated) that drives the signal line DTL and a write scan circuit (not illustrated) that selects each pixel 113 sequentially is configured to basically include a shift resister (not illustrated), and has a buffer circuit (not illustrated) for each stage, corresponding to each column or each row of pixels 113. For example, the buffer circuit within the write scan circuit is typically configured such that two inverter circuits are connected in series. Here the inverter circuit has, as illustrated in FIG. 17, for example, a single channel type of circuit configuration in which two n-channel MOS transistors $Tr_1$ and $Tr_2$ are connected in series. An inverter circuit 200 illustrated in FIG. 17 is inserted between high voltage wiring $L_H$ to which a high-level voltage is applied and low voltage wiring $L_L$ to which a low-level voltage is applied. The gate of the transistor $Tr_2$ on the high voltage wiring $L_H$ side is connected to the high voltage wiring $L_H$, and the gate of the transistor $Tr_1$ on the low voltage wiring $L_L$ side is connected to an input terminal IN. Further, a connection point C between the transistor $Tr_1$ and the transistor $Tr_2$ is connected to an output terminal OUT.

In the inverter circuit 200, as illustrated in FIG. 18, for example, when a voltage $V_{in}$ of the input terminal IN is $V_{ss}$, a voltage $V_{out}$ of the output terminal OUT is not $V_{dd}$, and instead is $V_{dd}$-$V_{th}$. In other words, the threshold voltage $V_{th}$ of the transistor $Tr_2$ is included in the voltage $V_{out}$ of the output terminal OUT, and the voltage $V_{out}$ of the output terminal OUT is largely affected by variations in the threshold voltage $V_{th}$ of the transistor $Tr_2$.

Thus, for example, as illustrated by an inverter circuit 300 in FIG. 19, it is conceivable that the gate and the drain of the transistor $Tr_2$ may be electrically separated from each other, and the gate may be connected to high voltage wiring $L_{H2}$ to which a voltage $V_{dd2}$ ($\geqq V_{dd} V_{th}$) that is higher than the voltage $V_{dd}$ of the drain is applied. In addition, for example, a bootstrap type of circuit configuration as illustrated by an inverter circuit 400 in FIG. 20 is conceivable. Specifically, it is conceivable to provide a circuit configuration in which a transistor $Tr_{12}$ is inserted between the gate of the transistor $Tr_2$ and the high voltage wiring $L_H$, the gate of the transistor $Tr_{12}$ is connected to the high voltage wiring $L_H$, and a capacitive element $C_{10}$ is inserted between: a connection point D between the gate of the transistor $Tr_2$ and the source of the transistor $Tr_{12}$; and the connection point C.

However, in the circuit in any of FIG. 17, FIG. 19 and FIG. 20, until the time when the input voltage $V_{in}$ becomes high, namely when the output voltage $V_{out}$ becomes low, a current (through current) flows from the high voltage wiring $L_H$ side to the low voltage wiring $L_L$ side via the transistors $Tr_1$ and $Tr_2$. As a result, power consumption in the inverter circuit also becomes large. In addition, in the circuits of FIG. 17, FIG. 19 and FIG. 20, when, for example, the input voltage $V_{in}$ is $V_{dd}$ as indicated with a point surrounded by a broken line in Part (B) of FIG. 18, the output voltage $V_{out}$ is not $V_{ss}$, and the peak value of the output voltage $V_{out}$ varies. As a result, there has been such a shortcoming that the threshold corrections and the mobility corrections of the drive transistors $Tr_{100}$ in pixel circuits 112 vary among the pixel circuits 112, and such variations result in variations in luminance.

Incidentally, the above-described shortcoming not only occurs in the scan circuit of the display device, but may take place similarly in any other devices.

In view of the foregoing, it is desirable to provide an inverter circuit capable of setting the peak value of an output voltage at a desired value while suppressing power consumption, and a display device having this inverter circuit.

According to an embodiment of the present invention, there is provided a first inverter circuit including: a first transistor, a second transistor, a third transistor, a fourth transistor, a fifth transistor, a sixth transistor and a seventh transistor each having channels of same conduction type; a first capacitive element; and an input terminal and an output terminal. The first transistor makes or breaks electric connection between the output terminal and a first voltage line, in response to a potential difference between a voltage of the input terminal and a voltage of the first voltage line or a potential difference corresponding thereto. The second transistor makes or breaks electric connection between a second voltage line and the output terminal, in response to a potential difference between a voltage of a first terminal that is a source or a drain of the seventh transistor and a voltage of the output terminal or a potential difference corresponding thereto. The third transistor makes or breaks electric connection between a gate of the seventh transistor and the third voltage line, in response to a potential difference between the voltage of the input terminal and a voltage of a third voltage line or a potential difference corresponding thereto. The fourth transistor makes or breaks electric connection between the first capacitive element and the gate of the seventh transistor, in response to a first control signal inputted into a gate of the fourth transistor. The fifth transistor makes or breaks electric connection between the first capacitive element and a fourth voltage line, in response to a second control signal inputted into a gate of the fifth transistor. The sixth transistor makes or breaks electric connection between the first terminal and the fifth voltage line, in response to a potential difference between the voltage of the input terminal and a voltage of a fifth voltage line or a potential difference corresponding thereto. The seventh transistor makes or breaks electric connection between the first terminal and a sixth voltage line, in response to a potential difference between a gate voltage of the seventh transistor and a gate voltage of the second transistor or a potential difference corresponding thereto. The first capacitive element is inserted between a drain or a source of the fifth transistor and a seventh voltage line.

According to an embodiment of the present invention, there is provided a first display device having a display section and a drive section, the display section including a plurality of scanning lines arranged in rows, a plurality of signal lines arranged in columns and a plurality of pixels arranged in rows and columns, and the drive section including a plurality of inverter circuits each provided for each of the scanning lines to drive each of the pixels. Each of the inverter circuits in the drive section includes the same elements as those of the above-described first inverter circuit.

In the first inverter circuit and the first display device according to the above embodiments of the present invention, between the gate of the seventh transistor and the first voltage line, between the gate of the second transistor and the first voltage line, between the source of the second transistor and the first voltage line, there are provided the first transistor, the third transistor and the sixth transistor, respectively, which perform on-off operation according to a potential difference between the input voltage and the voltage of the first voltage line. As a result, for example, when the input voltage falls, on-resistance of each of the first transistor, the third transistor and the sixth transistor gradually becomes large, and the time necessary to charge the gates and the sources of the second transistor and the seventh transistor to the voltage of the first voltage line becomes longer. Further, for example, when the input voltage rises, the on-resistance of each of the first transistor, the third transistor and the sixth transistor gradually becomes small, and the time necessary to charge the gate and the source of the second transistor to the voltage of the first voltage line becomes short. In addition, in the above embodiments of the present invention, when the input voltage falls, the gate of the seventh transistor is charged to a voltage equal to or higher than an on-voltage of the seventh transistor. As a result, for example, when a falling voltage is input into the input terminal, the first transistor, the third transistor and the sixth transistor are turned off, and immediately after that, the seventh transistor is turned on and further, the second transistor is turned on and therefore, the output voltage becomes the voltage on the second voltage line side. Moreover, for example, when the input voltage rises, the first transistor, the third transistor and the sixth transistor are turned on and immediately after that, the second transistor is turned off. As a result, the output voltage becomes the voltage on the first voltage line side.

According to an embodiment of the present invention, there is provided a second inverter circuit including: a first transistor, a second transistor, a third transistor, a fourth transistor, a fifth transistor, a sixth transistor and a seventh transistor each having channels of same conduction type; a first capacitive element; and an input terminal and an output terminal. A gate of the first transistor is electrically connected to the input terminal, one terminal of a drain and a source of the first transistor is electrically connected to a first voltage line, and the other terminal of the first transistor is electrically connected to the output terminal. One terminal of a drain and a source of the second transistor is electrically connected to a second voltage line, and the other terminal of the second transistor is electrically connected to the output terminal. A gate of the third transistor is electrically connected to the input terminal, one terminal of a drain and a source of the third transistor is electrically connected to a third voltage line, and the other terminal of the third transistor is electrically connected to a gate of the second transistor. A gate of the fourth transistor is supplied with a first control signal, and one terminal of a drain and a source of the fourth transistor is electrically connected to a gate of the seventh transistor. A gate of the fifth transistor is supplied with a second control signal, one terminal of a drain and a source of the fifth transistor is electrically connected to a fourth voltage line, and the other terminal of the fifth transistor is electrically connected to the other terminal of the fourth transistor. A gate of the sixth transistor is electrically connected to the input terminal, one terminal of a drain and a source of the sixth transistor is electrically connected to a fifth voltage line, and the other terminal of the sixth transistor is electrically connected to the gate of the second transistor. One terminal of a drain and a source of the seventh transistor is electrically connected to a sixth voltage line, and the other terminal of the seventh transistor is electrically connected to the gate of the second transistor. The first capacitive element is inserted between the other terminal of the fifth transistor and a seventh voltage line.

According to an embodiment of the present invention, there is provided a second display device having a display section and a drive section, the display section including a plurality of scanning lines arranged in rows, a plurality of signal lines arranged in columns and a plurality of pixels arranged in rows and columns, and the drive section including a plurality of inverter circuits each provided for each of the scanning lines to drive each of the pixels. Each of the inverter circuits in the drive section includes the same elements as those of the above-described second inverter circuit.

In the second inverter circuit and the second display device according to the above embodiments of the present invention, between the gate of the seventh transistor and the first voltage line, between the gate of the second transistor and the first voltage line, between the source of the second transistor and the first voltage line, there are provided the first transistor, the third transistor and the sixth transistor, respectively, whose gates are connected to the input terminal. As a result, for example, when the input voltage falls, on-resistance of each of the first transistor, the third transistor and the sixth transistor gradually becomes large, and the time necessary to charge the gates and the sources of the second transistor and the seventh transistor to the voltage of the first voltage line becomes longer. Further, for example, when the input voltage rises, the on-resistance of each of the first transistor, the third transistor and the sixth transistor gradually becomes small, and the time necessary to charge the gate and the source of the second transistor to the voltage of the first voltage line becomes short. In addition, in the above embodiments of the present invention, when the input voltage falls, the gate of the seventh transistor is charged to a voltage equal to or higher than an on-voltage of the seventh transistor. As a result, for example, when a falling voltage is input into the input terminal, the first transistor, the third transistor and the sixth transistor are turned off, and immediately after that, the seventh transistor is turned on and further, the second transistor is turned on and therefore, the output voltage becomes the voltage on the second voltage line side. Moreover, for example, when the input voltage rises, the first transistor, the third transistor and the sixth transistor are turned on and immediately after that, the second transistor is turned off. As a result, the output voltage becomes the voltage on the first voltage line side.

In the first and second inverter circuits and the first and second display devices according to the above-described embodiments of the present invention, a second capacitive element may be inserted between the gate and the source of the second transistor. In this case, a capacity of the second capacitive element is desired to be smaller than a capacity of the first capacitive element.

According to the first and second inverter circuits and the first and second display devices in the above-described embodiments of the present invention, there is no time period over which the first transistor and the second transistor are turned on at the same time, and the fourth transistor and the seventh transistor are turned on at the same time, and the third transistor, the fourth transistor and the fifth transistor are turned on at the same time. This makes it possible to suppress power consumption, because almost no current (through current) flows between the voltage lines, via these transistors. In addition, when the gate of the first transistor changes from high to low, the output voltage becomes a voltage on the second voltage line side or a voltage on the first voltage line side, and when the gate of the first transistor changes from low to high, the output voltage becomes a voltage on the reverse side of the above-mentioned side. This makes it possible to reduce a shift of the peak value of the output voltage from a desired value. As a result, for example, it is possible to reduce variations in the threshold correction and the mobility correction of the drive transistor in the pixel circuit, among the pixel circuits, and further, variations in the luminance among the pixels may be reduced.

Moreover, in the above-described embodiments of the present invention, on either of the low voltage side and the high voltage side, voltage lines may be provided as a single common voltage line. Therefore, in this case, there is no need to increase the withstand voltage of the inverter circuit.

Other and further objects, features and advantages of the invention will appear more fully from the following description.

DETAILED DESCRIPTION OF THE PREFERRED EMBODIMENTS

An embodiment of the present invention will be described below in detail with reference to the drawings. The description will be provided in the following order.

Figure 21:
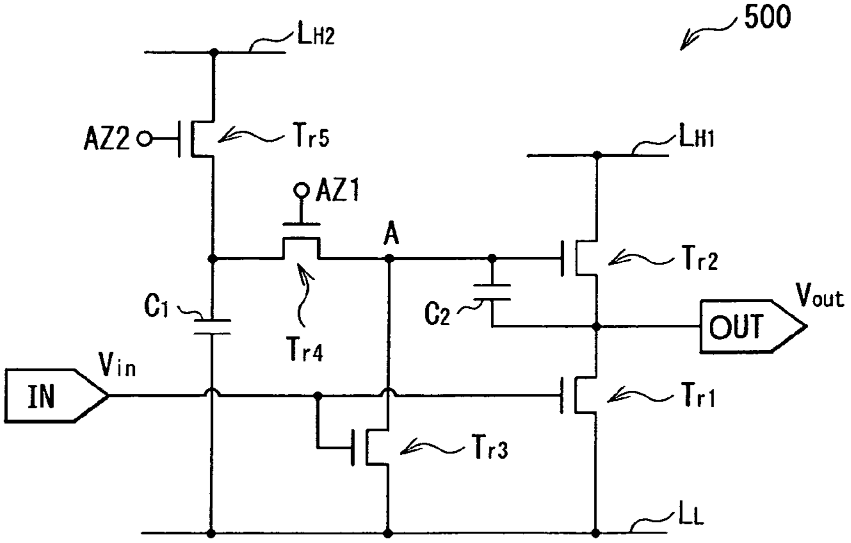
FIG. 21 RELATED ART
FIG. 21 is a circuit diagram illustrating an example of an inverter circuit according to a reference example.
Figure 22:
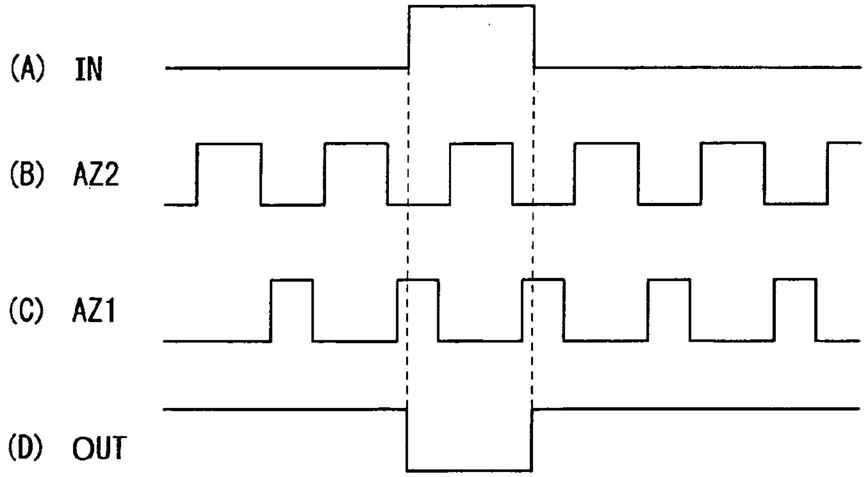
FIG. 22 RELATED ART
FIG. 22 is a waveform diagram illustrating an example of input-output signal waveforms of the inverter circuit in FIG. 21.

1. Embodiment (FIG. 1 through FIG. 10)
2. Modification (FIG. 11 and FIG. 12)
3. Application example (FIG. 13 through FIG. 15)
4. Description of related art (FIG. 16 through FIG. 20)
5. Description of reference technique (FIG. 21 and FIG. 22)

Embodiment

Configuration

Figure 1:
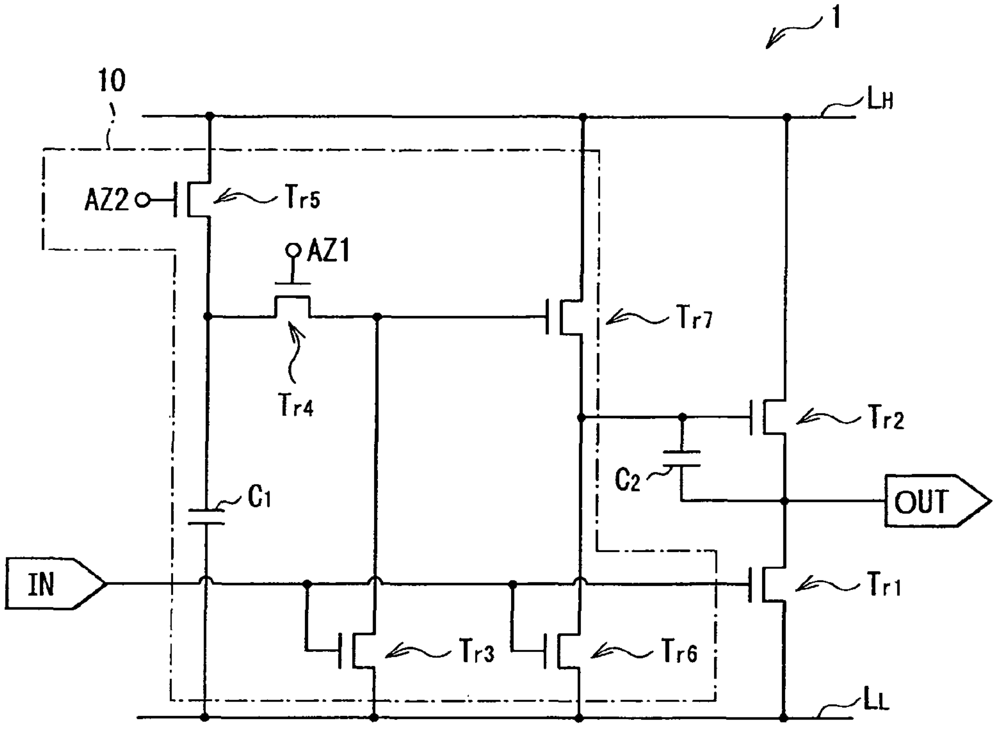
FIG. 1 is a circuit diagram illustrating an example of an inverter circuit according to an embodiment of the present invention.

FIG. 1 illustrates an example of the entire configuration of an inverter circuit 1 according to an embodiment of the present invention. The inverter circuit 1 outputs, from an output terminal OUT, a pulse signal (e.g., Part (B) of FIG. 2) whose waveform is approximately the inverse of the signal waveform of a pulse signal (e.g., Part (A) of FIG. 2) input into an input terminal IN. The inverter circuit 1 is suitably formed on an amorphous silicon or amorphous oxide semiconductor and has, for example, seven transistors $Tr_1$ to $Tr_7$ of the same channel type. In addition to the seven transistors $Tr_1$ to $Tr_7$, the inverter circuit 1 includes two capacitive elements $C_1$ and $C_2$, the input terminal IN and the output terminal OUT, and has a 7Tr2C circuit configuration.

The transistor $Tr_1$ is equivalent to a specific example of "the first transistor" according to the embodiment of the present invention, and the transistor $Tr_2$ is equivalent to a specific example of "the second transistor" according to the embodiment of the present invention, and the transistor $Tr_1$ is equivalent to a specific example of "the third transistor" according to the embodiment of the present invention. Further, the transistor $Tr_4$ is equivalent to a specific example of "the fourth transistor" according to the embodiment of the present invention, and the transistor $Tr_5$ is equivalent to a specific example of "the fifth transistor" according to the embodiment of the present invention. Furthermore, the transistor $Tr_6$ is equivalent to a specific example of "the sixth transistor" according to the embodiment of the present invention, and the transistor $Tr_7$ is equivalent to a specific example of "the seventh transistor" according to the embodiment of the present invention. Moreover, the capacitive element $C_1$ is equivalent to a specific example of "the first capacitive element" according to the embodiment of the present invention, and the capacitive element $C_2$ is equivalent to a specific example of "the second capacitive element" according to the embodiment of the present invention.

The transistors $Tr_1$ to $Tr_7$ are thin-film transistors (TFTs) of the same channel type and are, for example, n-channel MOS (Metal Oxide Film Semiconductor) type of thin-film transistors (TFTs). The transistor $Tr_1$ is, for example, configured to establish and cut off electric connection between the output terminal OUT and the low voltage line $L_L$, according to a potential difference $V_{gs1}$ (or a potential difference corresponding thereto) between a voltage (input voltage $V_{in}$) of the input terminal IN and a voltage $V_L$ of a low voltage line $L_L$. The gate of the transistor $Tr_1$ is electrically connected to the input terminal IN, and the source or the drain of the transistor $Tr_1$ is electrically connected to the low voltage line $L_L$. Of the source and the drain of the transistor $Tr_1$, one that is a terminal unconnected with the low voltage line $L_L$ is electrically connected to the output terminal OUT. The transistor $Tr_2$ is configured to establish and cut off electric connection between a high voltage line $L_H$ and the output terminal OUT, according to a potential difference $V_{gs2}$ (or a potential difference corresponding to thereto) between a voltage $V_{s7}$ of a terminal (terminal A) unconnected with the high voltage line $L_H$ and the voltage (output voltage $V_{out}$) of the output terminal OUT. The terminal A is one of the source and the drain of the transistor $Tr_7$. The gate of the transistor $Tr_2$ is electrically connected to the terminal A of the transistor $Tr_7$. The source or the drain of the transistor $Tr_2$ is electrically connected to the output terminal OUT, and of the source and the drain of the transistor $Tr_2$, one that is a terminal unconnected with the output terminal OUT is electrically connected to the high voltage line $L_H$.

The transistor $Tr_3$ is configured to establish and cut off electric connection between the gate of the transistor $Tr_7$ and the low voltage line $L_L$, according to a potential difference $V_{gs3}$ (or a potential difference corresponding thereto) between the input voltage $V_{in}$ and the voltage $V_L$ of the low voltage line $L_L$. The gate of the transistor $Tr_3$ is electrically connected to the input terminal IN. The source or the drain of the transistor $Tr_3$ is electrically connected to the low voltage line $L_L$, and of the source and the drain of the transistor $Tr_3$, one that is a terminal unconnected with the low voltage line $L_L$ is electrically connected to the gate of the transistor $Tr_7$. The transistor $Tr_4$ is configured to establish and cut off electric connection between the capacitive element $C_1$ and the gate of the transistor $Tr_7$, according to a control signal input into a control terminal AZ1. The gate of the transistor $Tr_4$ is electrically connected to the control terminal AZ1. The source or the drain of the transistor $Tr_4$ is electrically connected to the capacitive element $C_1$, and of the source and the drain of the transistor $Tr_4$, one that is a terminal unconnected with the capacitive element $C_1$ is electrically connected to the gate of the transistor $Tr_7$. The transistor $Tr_5$ is configured to establish and cut off electric connection between the high voltage line $L_H$ and the capacitive element $C_1$, according to a control signal input into a control terminal AZ2. The gate of the transistor $Tr_5$ is electrically connected to the control terminal AZ2. The source or the drain of the transistor $Tr_5$ is electrically connected to the high voltage line $L_H$. Of the source and the drain of the transistor $Tr_5$, one that is a terminal unconnected with the high voltage line $L_H$ is electrically connected to the capacitive element $C_1$.

The transistor $Tr_6$ is configured to establish and cut off electric connection between the terminal A of the transistor $Tr_7$ and the low voltage line $L_L$, according to a potential difference $V_{gs6}$ (or a potential difference corresponding thereto) between the input voltage $V_{in}$, and the voltage $V_L$ of the low voltage line $L_L$. The gate of the transistor $Tr_6$ is electrically connected to the input terminal IN. The source or the drain of the transistor $Tr_6$ is electrically connected to the low voltage line $L_L$, and of the source and the drain of the transistor $Tr_6$, one that is a terminal unconnected with the low voltage line $L_L$ is electrically connected to the terminal A of the transistor $Tr_7$. In other words, the transistors $Tr_1$, $Tr_3$ and $Tr_6$ are connected to the same voltage line (the low voltage line $L_L$). Therefore, the terminal on the low voltage line $L_L$ side of the transistor $Tr_1$, the terminal on the low voltage line $L_L$ side of the transistor $Tr_3$ and the terminal on the low voltage line $L_L$ side of the transistor $Tr_6$ are at the same potential. The transistor $Tr_7$ is configured to establish and cut off electric connection between the high voltage line $L_H$ and one, which is a terminal unconnected with the low voltage line $L_L$, of the source and the drain of the transistor $Tr_6$, according to a potential difference $V_{gs7}$ (or a potential difference corresponding thereto) between the voltage $V_{s7}$ of the terminal unconnected with the capacitive element $C_1$ of the source and the drain of the transistor $Tr_4$ and a gate voltage $V_{g2}$ (the voltage $V_{s7}$ of the terminal A) of the transistor $Tr_2$. The gate of the transistor $Tr_7$ is electrically connected to the terminal unconnected with the capacitive element $C_1$, which terminal is one of the source and the drain of the transistor $Tr_4$. The source or the drain of the transistor $Tr_7$ is electrically connected to the high voltage line $L_H$, and of the source and the drain of the transistor $Tr_7$, one that is the terminal (the terminal A) unconnected with the high voltage line $L_H$ is electrically connected to the terminal unconnected with the low voltage line $L_L$, which terminal is one of the source and the drain of the transistor $Tr_6$. In other words, the transistors $Tr_2$, $Tr_5$ and $Tr_7$ are connected to the same voltage line (high voltage line $L_H$). Therefore, the terminal on the high voltage line $L_H$ side of the transistor $Tr_2$, the terminal on the high voltage line $L_H$ side of the transistor $Tr_5$ and the terminal on the high voltage line $L_H$ side of the transistor $Tr_7$ are at the same potential.

The low voltage line $L_L$ is equivalent to a specific example of "the first voltage line" according to the embodiment of the present invention. The high voltage line $L_H$ is equivalent to a specific example of "the second voltage line" according to the embodiment of the present invention.

The high voltage line $L_H$ is connected to a power source (not illustrated) that outputs a voltage (constant voltage) higher than the voltage $V_L$ of the low voltage line $L_L$. The voltage of the high voltage line $L_H$ is $V_{dd}$ at the time of driving the inverter circuit 1. On the other hand, the low voltage line $L_L$ is connected to a power source (not illustrated) that outputs a voltage (constant voltage) lower than a voltage $V_H$ of the high voltage line $L_H$, and the voltage $V_L$ of the low voltage line $L_L$ is a voltage $V_{ss}$ ($<V_{dd}$) at the time of driving the inverter circuit 1.

The control terminal AZ1 is connected to a power source $S_1$ (not illustrated) that outputs a predetermined pulse signal. The control terminal AZ2 is connected to a power source $S_2$ (not illustrated) that outputs a predetermined pulse signal. The power source $S_1$ is, for example, configured to output a high while a low is applied to the control terminal AZ2, as illustrated in Part (C) of FIG. 2. On the other hand, the power source $S_2$ is, for example, configured to output a high while a low is applied to the control terminal AZ1, as illustrated in Part (B) of FIG. 2. In other words, the power source $S_1$ and the power source $S_2$ are configured to alternately output highs so that the transistors $Tr_4$ and $Tr_5$ are not in an ON state at the same time (namely, the transistors $Tr_4$ and $Tr_5$ are turned on and off alternately). The power source $S_1$ is configured such that the output voltage of the power source $S_1$ changes from low to high (in other words, the transistor $Tr_4$ is turned on), in timing different from the timing in which the input voltage $V_{in}$ rises. The power source $S_1$ is, for example, configured such that the output voltage of the power source $S_1$ changes from low to high immediately before the input voltage $V_{in}$ drops.

The capacitive element $C_1$ is inserted between the terminal unconnected with the high voltage line $L_H$, which is one of the source and the drain of the transistor $Tr_5$, and the low voltage line $L_L$. The capacitive element $C_2$ is inserted between the gate of the transistor $Tr_2$ and the source of the transistor $Tr_2$. The value of each of the capacitive element $C_1$ and the capacitive element $C_2$ is sufficiently larger than parasitic capacitances of the transistors $Tr_1$ to $Tr_7$. The value of the capacity of the capacitive element $C_1$ is larger than the capacity of the capacitive element $C_2$. When a falling voltage is input into the input terminal IN, and the transistor $Tr_3$ is turned off, the value of the capacity of the capacitive element $C_1$ becomes a value that makes it possible to charge the gate of the transistor $Tr_7$ to a voltage of $V_{ss}+V_{th7}$ or more. In addition, the $V_{th7}$ is a threshold voltage of the transistor $Tr_7$.

Incidentally, in a relation with an inverter circuit in related art (the inverter circuit 200 in FIG. 17), the inverter circuit 1 is equivalent to a circuit in which a control element 10 and the capacitive element $C_2$ are inserted between the transistors $Tr_1$ and $Tr_2$ in an output stage and the input terminal IN. Here, for example, as illustrated in FIG. 1, the control element 10 includes a terminal $P_1$ electrically connected to the input terminal IN, a terminal $P_2$ electrically connected to the low voltage line $L_L$, a terminal $P_3$ electrically connected to the gate of the transistor $Tr_2$ and a terminal $P_4$ electrically connected to a high voltage line $L_{H2}$. The control element 10 further includes, for example, as illustrated in FIG. 1, the transistors $Tr_3$ to $Tr_7$ and the capacitive element $C_1$.

The control element 10 is, for example, configured to charge the gate of the transistor $Tr_2$ electrically connected to the terminal $P_3$ to a voltage of $V_{ss}+V_{th2}$ or more when a falling voltage is input into the terminal $P_1$. Further, for example, the control element 10 is configured to cause the gate voltage $V_{g2}$ of the transistor $Tr_2$ electrically connected to the terminal $P_3$ to be a voltage of less than $V_{ss}+V_{th2}$ when a rising voltage is input into the terminal $P_1$. Incidentally, the description of the operation of the control element 10 will be provided with the following description of the operation of the inverter circuit 1.

[Operation]

Figure 3:
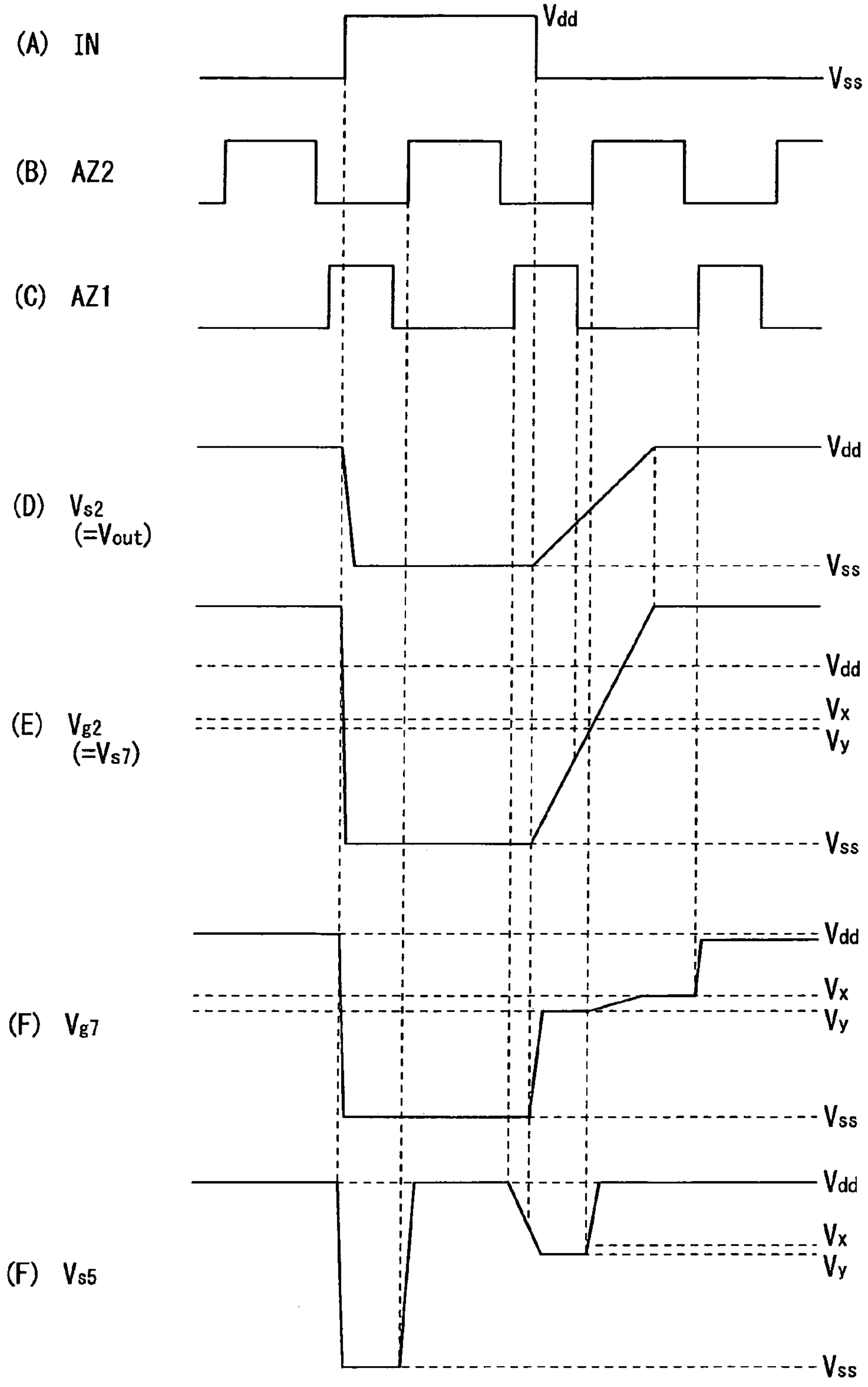
FIG. 3 is a waveform diagram illustrating an example of the operation of the inverter circuit in FIG. 1.

Next, there will be described an example of the operation of the inverter circuit 1 with reference to FIG. 3 to FIG. 10. FIG. 3 is a waveform diagram illustrating an example of the operation of the inverter circuit 1. FIG. 4 through FIG. 10 are circuit diagrams illustrating an example of a series of operation of the inverter circuit 1.

Figure 4:
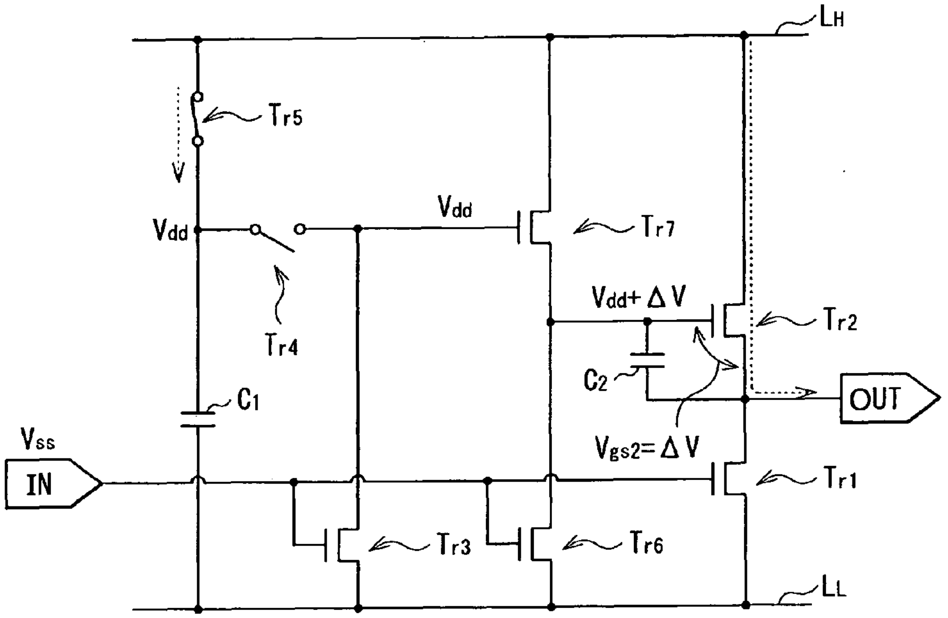
FIG. 4 is a circuit diagram for explaining an example of the operation of the inverter circuit in FIG. 1.

First, as illustrated in FIG. 4, it is assumed that the input voltage $V_{in}$ is low ($V_{ss}$), the transistor $Tr_5$ is on, and the transistor $Tr_4$ is off. At the time, the transistors $Tr_1$ and $Tr_3$ are off, the capacitive element $C_1$ is charged with $V_{dd}$, and a source voltage $V_{s5}$ of the transistor $Tr_5$ is $V_{dd}$. Further, the gate voltage $V_{g2}$ of the transistor $Tr_2$ is $V_{dd}+\Delta V$. Here, $\Delta V$ is a value equal to or higher than the threshold voltage $V_{th2}$ of the transistor $Tr_2$, and the transistor $Tr_2$ is on. Therefore, at the time, in the output terminal OUT, $V_{dd}$ is output as the output voltage $V_{out}$.

Figure 5:
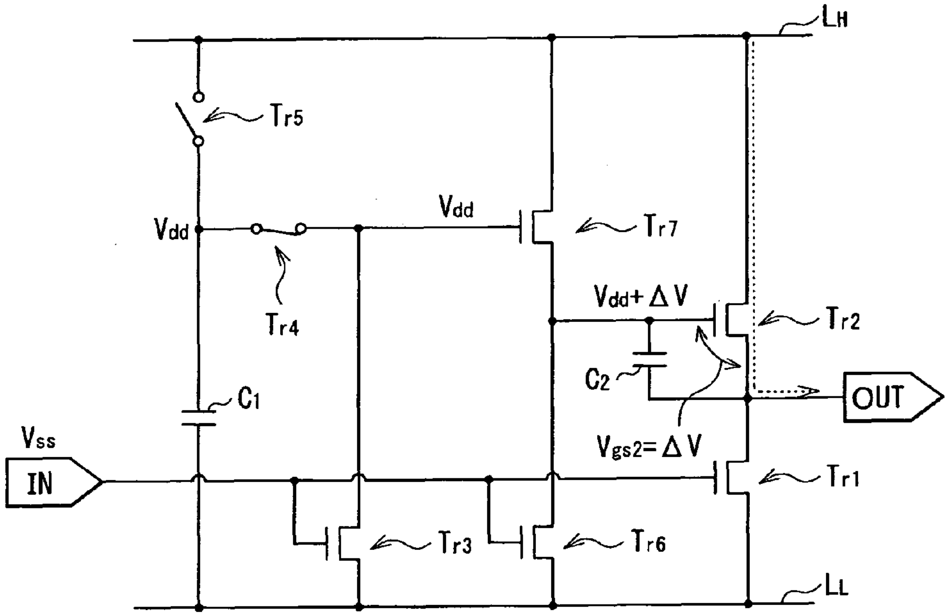
FIG. 5 is a circuit diagram for explaining an example of the operation following FIG. 4.

Subsequently, as illustrated in FIG. 5, in a state in which the input voltage $V_{in}$ is low ($V_{ss}$), the transistor $Tr_4$ is turned on after the transistor $Tr_5$ is turned off. In other words, the transistor $Tr_4$ is turned on before the input voltage $V_{in}$ changes from low ($V_{ss}$) to high ($V_{dd}$). The gate voltage $V_{g2}$ of the transistor $Tr_2$ is $V_{dd}+\Delta V$ before the transistor $Tr_4$ is turned on. Therefore, even when the transistor $Tr_4$ changes from OFF to ON, the transistor $Tr_2$ maintains the ON state, and $V_{dd}$ is maintained for the output voltage $V_{out}$ as well.

Figure 6:
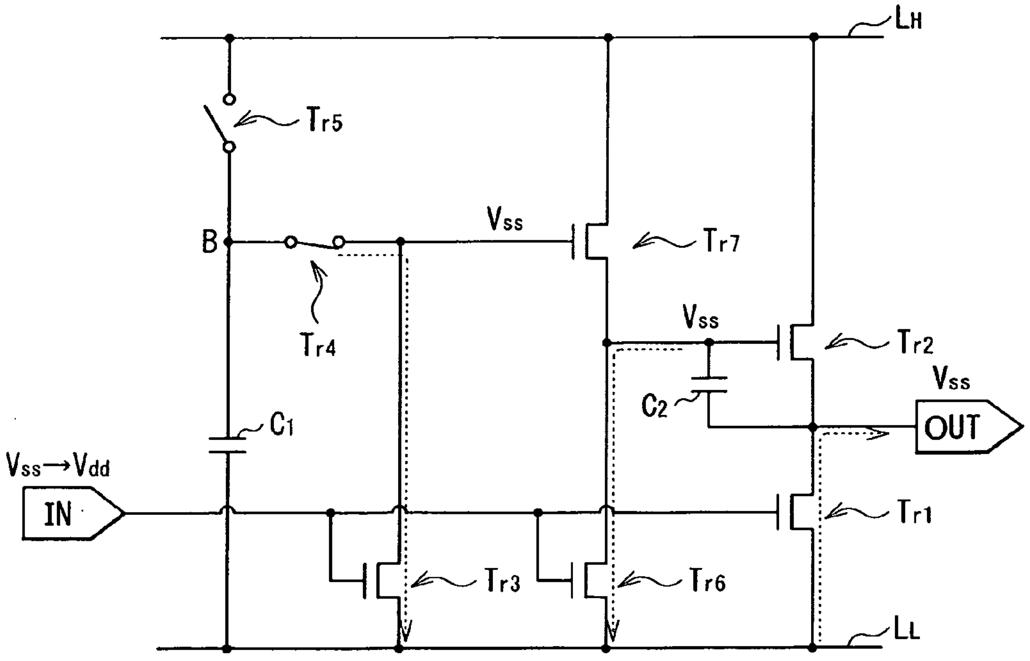
FIG. 6 is a circuit diagram for explaining an example of the operation following FIG. 5.

Next, in a state in which the input voltage $V_{in}$ is low ($V_{ss}$), the transistor $Tr_5$ is turned on after the transistor $Tr_4$ is turned off. Similarly, when the transistor $Tr_4$ is turned on (when the transistor $Tr_5$ is turned off) after the transistors $Tr_4$ and $Tr_5$ repeat ON and OFF, the input voltage $V_{in}$ changes from low ($V_{ss}$) to high ($V_{dd}$) (FIG. 6). Then, the transistors $Tr_1$, $Tr_3$ and $Tr_6$ are turned on, and the gates and the sources of the transistors $Tr_2$ and $Tr_7$ are charged to the voltage $V_L$ ($=V_{ss}$) of the low voltage line $L_L$. As a result, the transistor $Tr_2$ is turned off, and in the output terminal OUT, $V_{ss}$ is output as the output voltage $V_{out}$. Further, when the transistor $Tr_4$ is turned on, the capacitive element $C_1$ charged with $V_{dd}$ is connected to the low voltage line $L_L$ via the transistor $Tr_4$. As a result, the voltage of the terminal (terminal B) on the transistor $Tr_5$ side of the capacitive element $C_1$ gradually decreases from $V_{dd}$ and eventually becomes $V_{ss}$.

Subsequently, in a state in which the input voltage $V_{in}$ is high ($V_{dd}$), the transistor $Tr_5$ is turned on after the transistor $Tr_4$ is turned off. Similarly, when the transistor $Tr_4$ is turned on (when the transistor $Tr_5$ is off) after the transistors $Tr_4$ and $Tr_5$ repeat ON and OFF, the input voltage $V_{in}$ changes from high ($V_{dd}$) to low ($V_{ss}$). Then, the transistors $Tr_1$, $Tr_3$ and $Tr_6$ are turned off.

Figure 7:
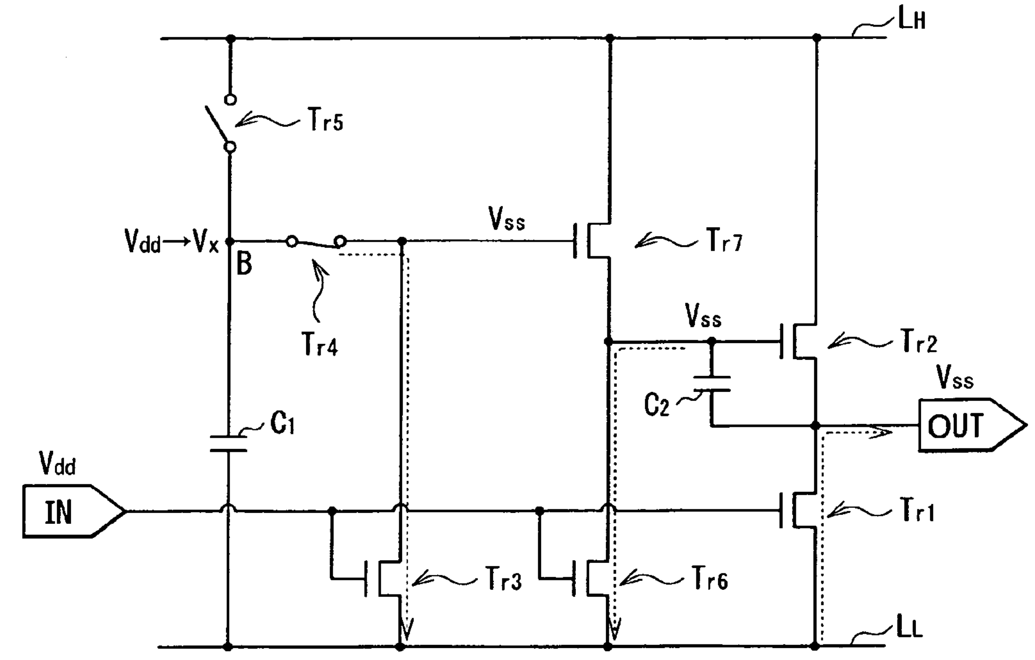
FIG. 7 is a circuit diagram for explaining an example of the operation following FIG. 6.
Figure 8:
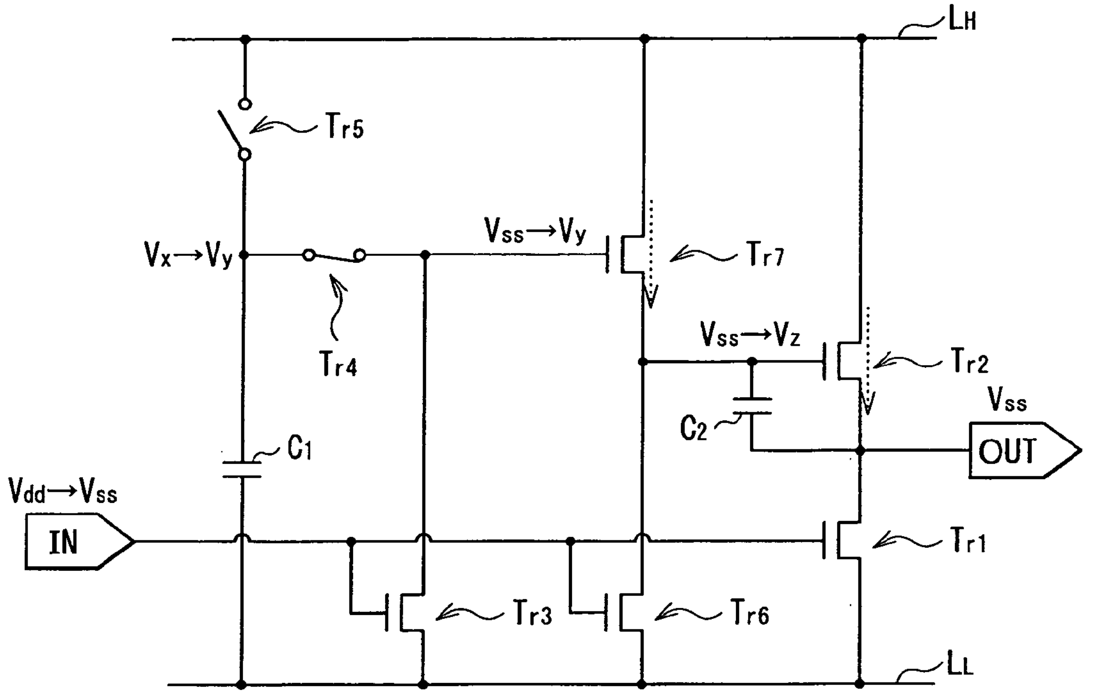
FIG. 8 is a circuit diagram for explaining an example of the operation following FIG. 7.

Here, when the transistor $Tr_4$ is turned on, the voltage (the voltage of the terminal B) of the capacitive element $C_1$ gradually decreases from $V_{dd2}$ as described above (FIG. 7). Incidentally, $V_X$ in FIG. 7 is the voltage (the voltage of the terminal B) of the capacitive element $C_1$ in a state immediately before the input voltage $V_{in}$ changes from high ($V_{dd}$) to low ($V_{ss}$). However, after the transistor $Tr_4$ is turned on, the input voltage $V_{in}$ changes from high ($V_{dd}$) to low ($V_{ss}$), and the transistor $Tr_3$ is turned off (FIG. 8). Therefore, the capacitive element $C_1$ is connected to the gate of the transistor $Tr_7$ via the transistor $Tr_4$ and thus, the capacitive element $C_1$ charges the gate of the transistor $Tr_7$. As a result, each of the voltage of the capacitive element $C_1$ and the gate voltage $V_{g2}$ of the transistor $Tr_2$ becomes a voltage $V_y$.

At the time, in a case in which $V_y$ is a value equal to or larger than the sum of the voltage ($=V_{ss}$) of the low voltage line $L_L$ and the threshold voltage $V_{th7}$ of the transistor $Tr_7$ (that is, $V_{ss}+V_{th7}$), the transistor $Tr_7$ is turned on, and a current flows in the transistor $Tr_7$.

Here, the voltage $V_y$ will be considered. It is assumed that parasitic capacitances of the transistors $Tr_1$ through $Tr_7$ are small enough to be ignored as compared with the capacitive element $C_1$. At the time, $V_y$ is expressed by an equation (1) using V.

$$V_y=V_X \tag{1}$$

It is apparent from the equation (1) that $V_y$ is determined without relying on the capacity of the capacitive element $C_1$, and $V_y$ always becomes $V_X$.

The source of the transistor $Tr_7$ and the gate of the transistor $Tr_2$ are electrically connected to each other. Therefore, when a current flows in the transistor $Tr_7$, the gate voltage $V_{g2}$ of the transistor $Tr_2$ starts rising. After a lapse of a predetermined period of time, when the gate voltage $V_{g2}$ of the transistor $Tr_2$ becomes $V_s$, $+V_{th2}$ or more, the transistor $Tr_2$ is turned on and the output voltage $V_{out}$ begins increasing gradually.

Between the gate and the source of the transistor $Tr_2$, the capacitive element $C_2$ is connected. Therefore, due to bootstrap operation by the capacitive element $C_2$, the gate voltage $V_{g2}$ of the transistor $Tr_2$ also changes as a source voltage $V_{s2}$ of the transistor $Tr_2$ changes. Here, when attention is paid to the gate and the source of the transistor $Tr_2$, it is found that the gate voltage $V_{g2}$ of the transistor $Tr_2$ rises due to the current of the transistor $Tr_7$ and the rise in the source of the transistor $Tr_2$. Therefore, because its transient is faster than that in a case of a rise only due to the current of the transistor $Tr_2$, the voltage $V_{gs2}$ between the gate and the source of the transistor $Tr_2$ gradually rises.

Here, a gate voltage $V_{g7}$ of the transistor $Tr_7$ is $V_y$, and the transistor $Tr_4$ between the gate of the transistor $Tr_7$ and the low voltage line $L_L$ is on. Therefore, the capacitive element $C_1$ is connected to the gate of the transistor $Tr_7$ and thus, the gate voltage $V_{g7}$ of the transistor $Tr_7$ hardly follows the change of the source voltage $V_{s7}$, and is approximately a value of $V_y$. As a result, the current from the transistor $Tr_7$ becomes small as the gate voltage $V_{g2}$ of the transistor $Tr_2$ rises. Eventually, when the voltage $V_{gs7}$ between the gate and the source of the transistor $Tr_7$ becomes the threshold voltage $V_{th7}$ of the transistor $Tr_7$, the current from the transistor $Tr_7$ becomes considerably small, and due to the current from the transistor $Tr_7$, the gate voltage $V_{g2}$ of the transistor $Tr_2$ hardly increases. However, at the time, the transistor $Tr_2$ is on, and the source voltage $V_{s2}$ (the output voltage $V_{out}$) of the transistor $Tr_2$ continues rising and thus, the gate voltage $V_{g2}$ of the transistor $Tr_2$ also keeps rising due to the bootstrap operation, and the transistor $Tr_7$ is turned off completely.

Figure 9:
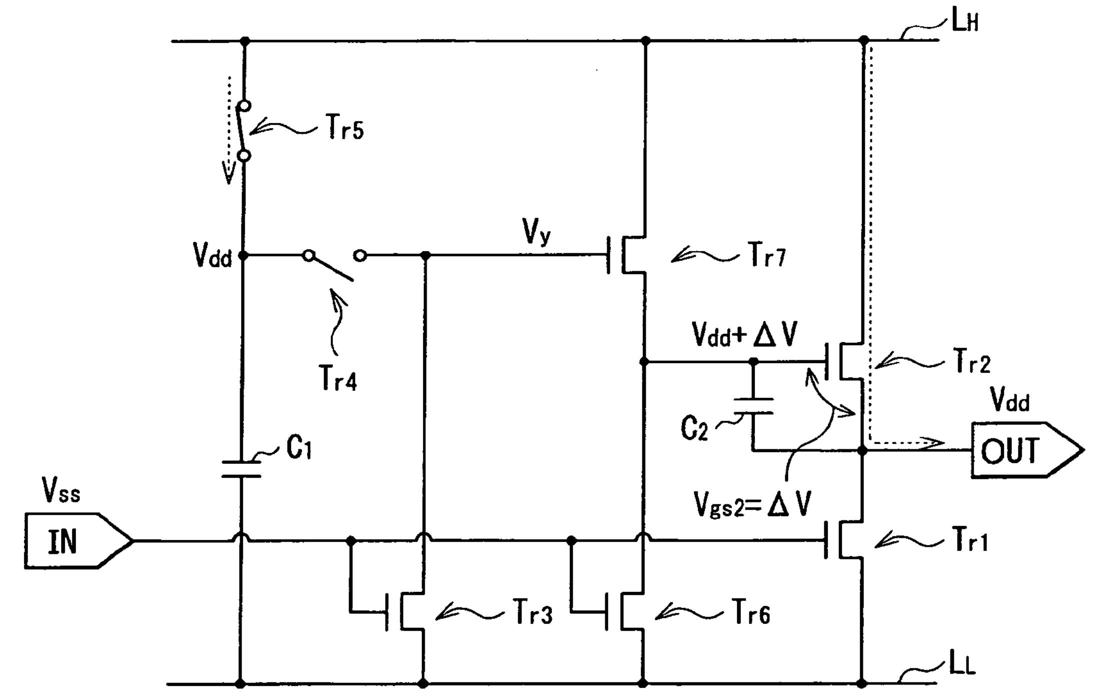
FIG. 9 is a circuit diagram for explaining an example of the operation following FIG. 8.

At the time, when the voltage $V_{gs2}$ between the gate and the source of the transistor $Tr_2$ is $\Delta V$, and if $\Delta V$ is larger than the threshold voltage $V_{th2}$ of the transistor $Tr_2$, $V_{dd}$ is output to the outside as the output voltage $V_{out}$ (FIG. 9).

Subsequently, the transistor $Tr_4$ is turned off. Even if the transistor $Tr_4$ is turned off, the transistor $Tr_7$ also is turned off and thus, the gate voltage $V_{g2}$ of the transistor $Tr_2$ is not affected. Therefore, the output of $V_{dd}$ to the outside as the output voltage $V_{out}$ continues. Further, after the transistor $Tr_4$ is turned off, the transistor $Tr_5$ is turned on again, and the source voltage $V_{s5}$ of the transistor $Tr_5$ becomes an electric potential of $V_{dd}$.

Figure 10:
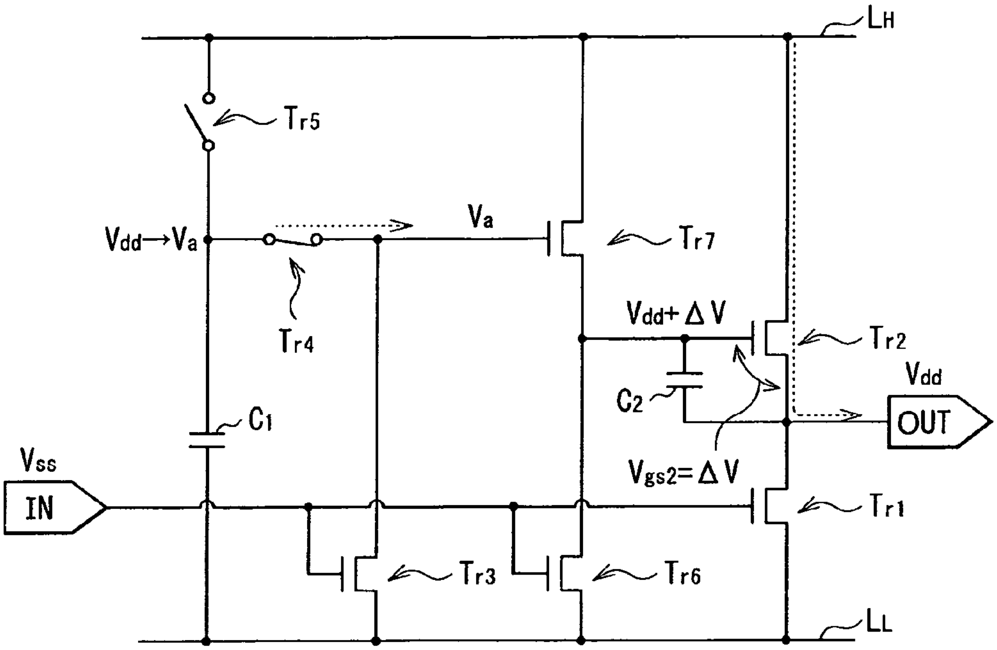
FIG. 10 is a circuit diagram for explaining an example of the operation following FIG. 9.
Figure 11:
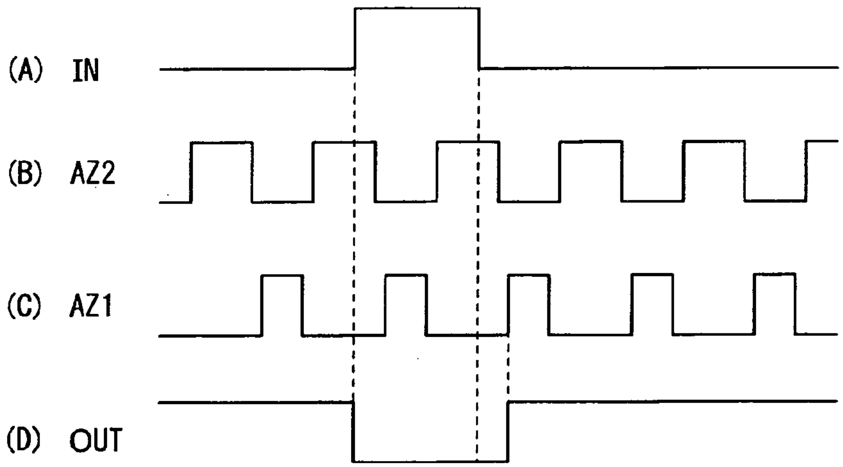
FIG. 11 is a waveform diagram illustrating another example of the input-output signal waveforms of the inverter circuit in FIG. 1.

When the transistor $Tr_4$ is turned on after the transistor $Tr_5$ is turned off, capacitive coupling occurs again, and the gate voltage $V_{g7}$ of the transistor $Tr_7$ and the source voltage $V_{s5}$ of and the transistor $Tr_5$ come to be at the same potential. When the voltage $V_{gs7}$ of the transistor $Tr_7$ at the time is assumed to be $V_a$, as illustrated in FIG. 10, the gate voltage $V_{g7}$ between the gate and the source of the transistor $Tr_7$ is $V_a-V_{dd}-\Delta V$, and the transistor $Tr_7$ still remains off. In addition, the voltage $V_{gs2}$ between the gate and the source of the transistor $Tr_2$ continues to be $\Delta V$ and thus, $V_{dd}$ is output to the outside as the output voltage $V_{out}$. By repeating these operations, the gate voltage $V_{g7}$ of the transistor $Tr_7$ eventually becomes $V_{dd}$.

Figure 2:
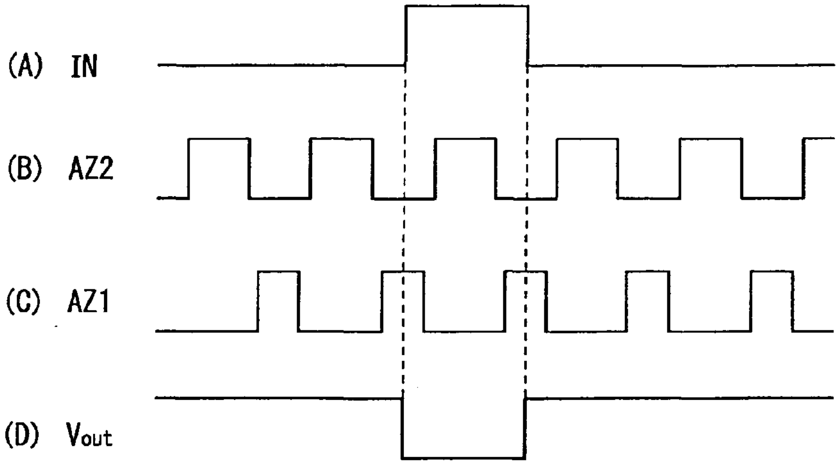
FIG. 2 is a waveform diagram illustrating an example of input-output signal waveforms of the inverter circuit in FIG. 1.

As described above, in the inverter circuit 1 of the present embodiment, the pulse signal (e.g., Part (B) of FIG. 2) whose signal waveform is approximately the inverse of the signal waveform (e.g., Part (A) of FIG. 2) of the pulse signal input into the input terminal IN is output from the output terminal OUT.

[Effect]

Figure 17:
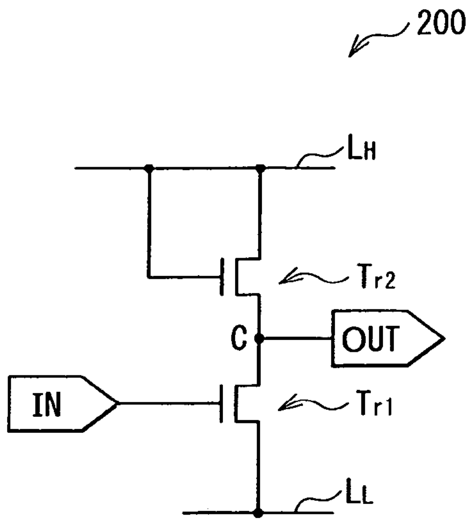
FIG. 17 RELATED ART
FIG. 17 is a circuit diagram illustrating an example of an inverter circuit in related art.
Figure 18:
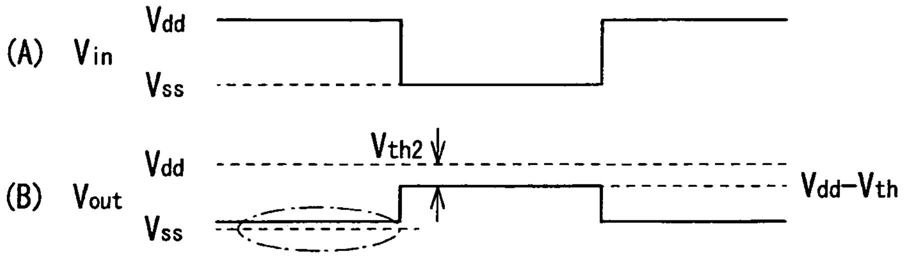
FIG. 18 RELATED ART
FIG. 18 is a waveform diagram illustrating an example of input-output signal waveforms of the inverter circuit in FIG. 17.

Incidentally, for example, the inverter circuit 200 as illustrated in FIG. 17 in related art has the single channel type of circuit configuration in which the two n-channel MOS transistors $Tr_1$ and $Tr_2$ are connected in series. In the inverter circuit 200, for example, as illustrated in FIG. 18, when the input voltage $V_{in}$ is $V_{ss}$, the output voltage $V_{out}$ is $V_{dd}-V_{th2}$ without being $V_{dd}$. In other words, the threshold voltage $V_{th2}$ of the transistor $Tr_2$ is included in the output voltage $V_{out}$, and the output voltage $V_{out}$ is greatly affected by the variations of the threshold voltage $V_{th2}$ of the transistor $Tr_2$.

Figure 19:
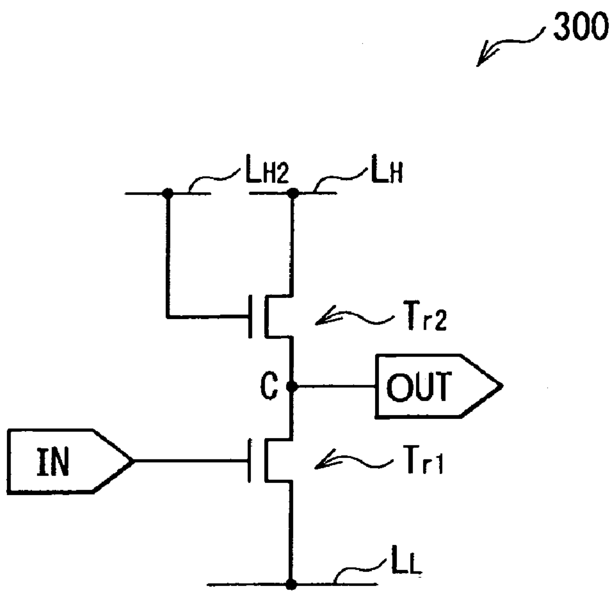
FIG. 19 RELATED ART
FIG. 19 is a circuit diagram illustrating another example of the inverter circuit in related art.

Thus, for example, as illustrated in the inverter circuit 300 of FIG. 19, it is conceivable that the gate and the drain of the transistor. $Tr_2$ may be electrically isolated from each other, and the gate may be connected to the high voltage wiring $L_{H2}$ to which the voltage $V_{dd2}$ ($\geqq V_{dd}+V_{th2}$) higher than the voltage $V_{dd}$ of the drain is applied. In addition, for example, it is conceivable to provide the bootstrap type of circuit configuration as indicated by the inverter circuit 400 in FIG. 20.

Figure 20:
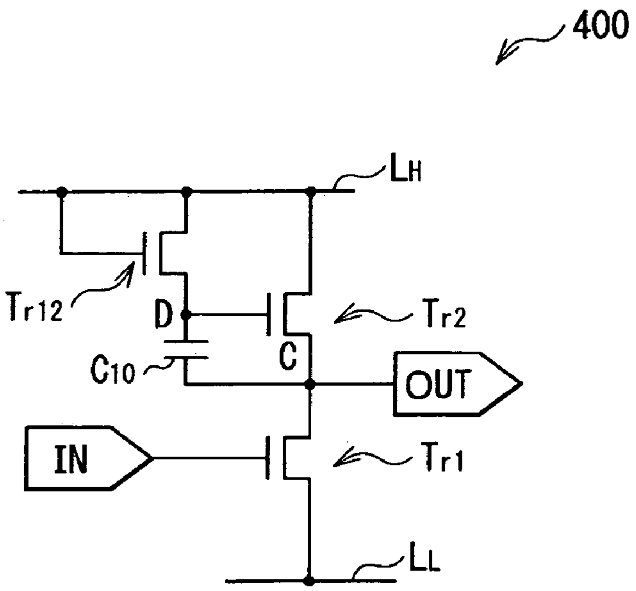
FIG. 20 RELATED ART
FIG. 20 is a circuit diagram illustrating another example of the inverter circuit in related art.

However, in the circuit in any of FIG. 17, FIG. 19 and FIG. 20, until the time when the input voltage $V_{in}$ becomes high, namely when the output voltage $V_{out}$ becomes low, a current (through current) flows from the high voltage wiring $L_H$ side to the low voltage wiring $L_L$ side via the transistors $Tr_1$ and $Tr_2$. As a result, the power consumption in the inverter circuit also becomes large. In addition, in the circuits of FIG. 17, FIG. 19 and FIG. 20, when, for example, the input voltage $V_{in}$ is $V_{dd}$ as indicated with the point surrounded by the broken line in Part (B) of FIG. 18, the output voltage $V_{out}$ is not $V_{ss}$, and the peak value of the output voltage $V_{out}$ varies. Therefore, for example, when any of these inverter circuits is applied to a scanner in an organic electroluminescence display device employing an active matrix system, the threshold corrections and the mobility corrections of the drive transistors in the pixel circuits vary among the pixel circuits, and such variations result in variations in luminance.

Thus, for example, as indicated by an inverter circuit 500 in FIG. 21, it is conceivable that between the transistors $Tr_1$ and $Tr_2$ in the output stage and the input terminal IN, the capacitive elements $C_1$ and $C_2$ and the transistors $Tr_3$ through $Tr_5$ may be provided, and a control signal as illustrated in FIG. 22 may be input into the transistors $Tr_4$ and $Tr_5$. In the inverter circuit 500, there is almost no time period over which the transistor $Tr_1$ and the transistor $Tr_2$ are turned on at the same time. Therefore, almost no through current flows, and power consumption may be suppressed to a low level. In addition, in response to a fall in the input voltage $V_{in}$, the output voltage $V_{out}$ becomes a voltage on a high voltage line $V_{H1}$ side, and in response to a rise in the input voltage $V_{in}$, the output voltage $V_{out}$ becomes a voltage on the low voltage line $L_L$ side. Therefore, there are no variations in the output voltage $V_{out}$, and variations in luminance from pixel to pixel may be reduced.

Incidentally, in the inverter circuit 500 of FIG. 21, the newly inserted transistor $Tr_5$ is connected to a high voltage line $L_{H2}$ to which a voltage higher than the high voltage line $L_{H1}$ connected to the transistor $Tr_2$ is applied. This is to enable turning on of the transistor $Tr_2$ when the gate of the transistor $Tr_2$ is charged by the capacitive element $C_1$ charged with the voltage $V_{dd2}$. However, the voltage applied to the high voltage line $L_{H2}$ is the voltage higher than the input voltage $V_{in}$. Therefore, when the withstand voltage of the inverter circuit 500 is made equal to the withstand voltage of the inverter circuit 200, yields may be reduced. Moreover, when the withstand voltage of the inverter circuit 500 is made higher than the withstand voltage of the inverter circuit 200, manufacturing cost may increase.

On the other hand, in the inverter circuit 1 of the present embodiment, between the gate of the transistor $Tr_7$ and the low voltage line $L_L$, between the gate of the transistor $Tr_2$ and the low voltage line $L_L$, and between the source of the transistor $Tr_2$ and the low voltage line $L_L$, the transistors $Tr_1$, $Tr_3$ and $Tr_6$ that perform on-off operation according to a potential difference between the input voltage $V_{in}$ and the voltage $V_L$ of the low voltage line $L_L$ are provided, respectively. As a result, when the gate voltage of each of the transistors $Tr_1$, $Tr_3$ and $Tr_6$ changes (falls) from high ($V_{dd}$) to low ($V_{ss}$), on-resistance of each of the transistors $Tr_1$, $Tr_3$ and $Tr_6$ gradually becomes large, and the time necessary to charge the gates and the sources of the transistors $Tr_2$ and $Tr_7$ to the voltage $V_L$ of the low voltage line $L_L$ becomes long. Further, when the gate voltage of each of the transistors $Tr_1$, $Tr_3$ and $Tr_6$ changes (rises) from low ($V_{ss}$) to high ($V_{dd}$), the on-resistance of each of the transistors $Tr_1$, $Tr_3$ and $Tr_6$ gradually becomes small, and the time necessary to charge the gates and the sources of the transistors $Tr_2$ and $Tr_7$ to the voltage $V_L$ of the low voltage line $L_L$ becomes short. Furthermore, in the inverter circuit 1 of the present embodiment, when the input voltage $V_{in}$ falls, the gate of the transistor $Tr_7$ is charged to a voltage equal to or higher than the on-voltage of the transistor $Tr_7$. As a result, when the falling voltage is input into the input terminal IN, the transistors $Tr_1$, $Tr_3$ and $Tr_6$ are turned off, and immediately after that, the transistor $Tr_7$ is turned on and further, the transistor $Tr_2$ is turned on and thus, the output voltage $V_{out}$ becomes the voltage on the high voltage line $L_H$ side. Moreover, when the input voltage $V_{in}$ rises, the transistors $Tr_1$, $Tr_3$ and $Tr_6$ are turned on, and immediately after that, the transistors $Tr_2$ and $Tr_7$ are turned off. As a result, the output voltage $V_{out}$ becomes the voltage on the low voltage line $L_L$ side.

In this way, the inverter circuit 1 of the present embodiment is configured such that there are no time period over which the transistor $Tr_1$ and the transistor $Tr_2$ are turned on at the same time, time period over which the transistor $Tr_6$ and the transistor $Tr_7$ are turned on at the same time, and time period over which the transistors $Tr_3$ to $Tr_5$ are turned on at the same time. Therefore, there is almost no current (through current) that flows between the high voltage line $V_H$ and the low voltage line $L_L$ via the transistors $Tr_1$ to $Tr_7$. As a result, power consumption is allowed to be suppressed. In addition, in the inverter circuit 1, only a single voltage line is provided on each of the low voltage side and the high voltage side and thus, there is no need to increase the withstand voltage of the inverter circuit 1. Based upon the foregoing, in the present embodiment, it is possible to reduce the power consumption without increasing the withstand voltage.

<Modification>

In the embodiment described above, for example, as illustrated in FIG. 11 and FIG. 12, the transistor $Tr_4$ may be turned off when the falling voltage is input into the input terminal IN, and the transistor $Tr_4$ may be turned on after the falling voltage is input into the input terminal IN. In this case, it is possible to prevent the voltage (the source voltage of the transistor $Tr_5$) of the capacitive element $C_1$ from decreasing from $V_{dd2}$ by the transistor $Tr_3$. As a result, it is possible to cause the inverter circuit 1 to operate at a high speed.

In addition, in the embodiment and the modification described above, for example, although not illustrated, it is possible to delete the capacitive element $C_2$ in the inverter circuit 1. Even in this case, it is possible to cause the inverter circuit 1 to operate at a higher speed.

Further, in the embodiment and the modification described above, the transistors $Tr_1$ to $Tr_7$ are formed by the n-channel MOS TFTs, but may be formed by p-channel MOS TFTs, for example. In this case however, the high voltage line $V_H$ is replaced with the low voltage line $L_L$, and the high voltage line $V_H$ is replaced with the low voltage line $L_L$. Furthermore, a transient response when the transistors $Tr_1$ to $Tr_7$ change (rise) from low to high and a transient response when the transistors $Tr_1$ to $Tr_7$ change (drop) from high to low are reversed.

<Application Example>

Figure 13:
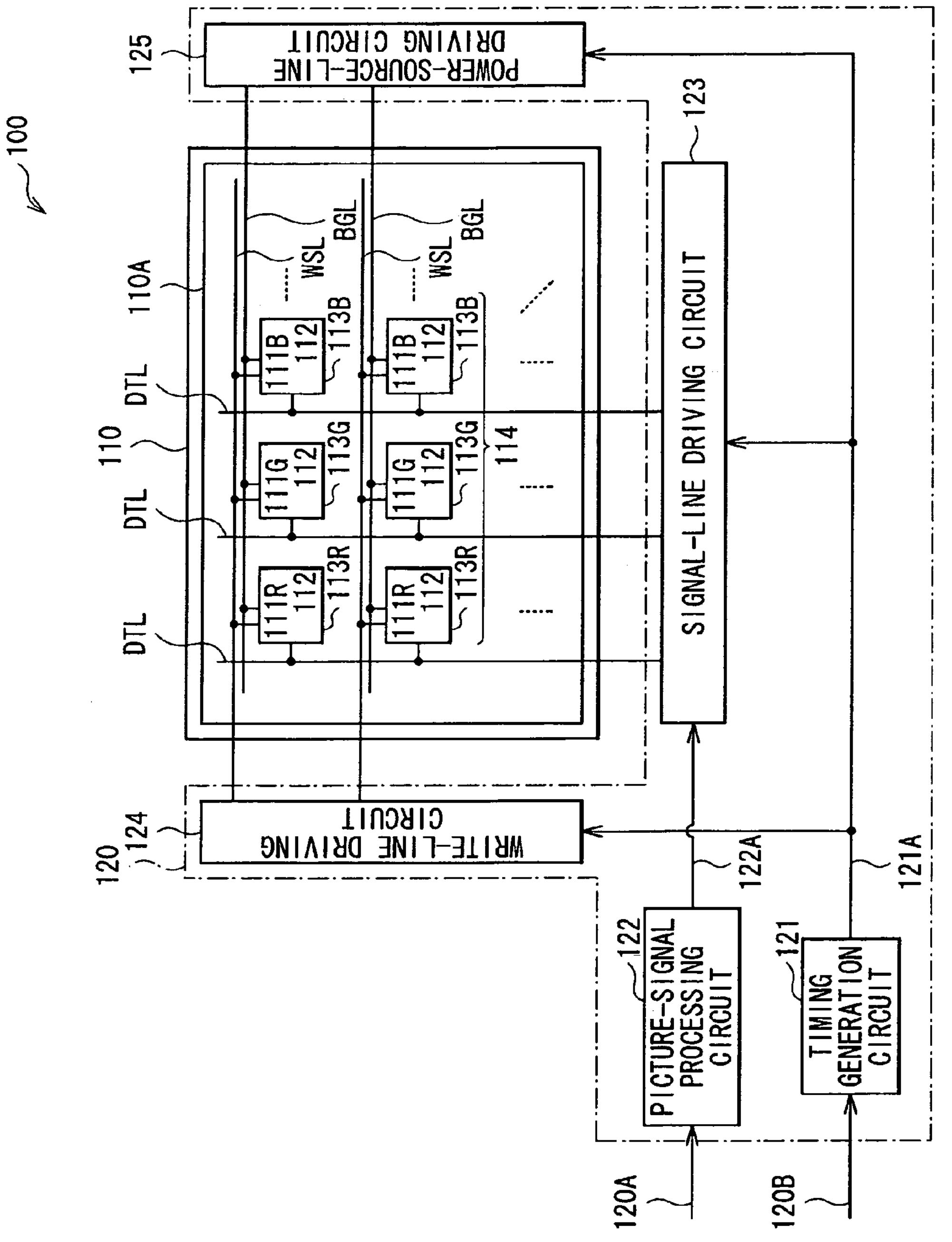
FIG. 13 is a schematic configuration diagram of a display device that is one of application examples of the inverter circuit in the present embodiment and its modification.

FIG. 13 illustrates an example of the entire configuration of a display device 100 that is one of application examples of the inverter circuit 1 according to each of the above-described embodiment and the modifications. This display device 100 includes, for example, a display panel 110 (display section) and a driving circuit 120 (drive section).

(Display Panel 110)

The display panel 110 includes a display area 110A in which three kinds of organic EL elements 111R, 111G and 111B emitting mutually different colors are arranged two-dimensionally. The display area 110A is an area that displays an image by using light emitted from the organic EL elements 111R, 111G and 111B. The organic EL element 111R is an organic EL element that emits red light, the organic EL element 111G is an organic EL element that emits green light, and the organic EL element 111B is an organic EL element that emits blue light. Incidentally, in the following, the organic EL elements 111R, 111G and 111B will be collectively referred to as an organic EL element 111 as appropriate.

(Display Area 110A)

Figure 12:
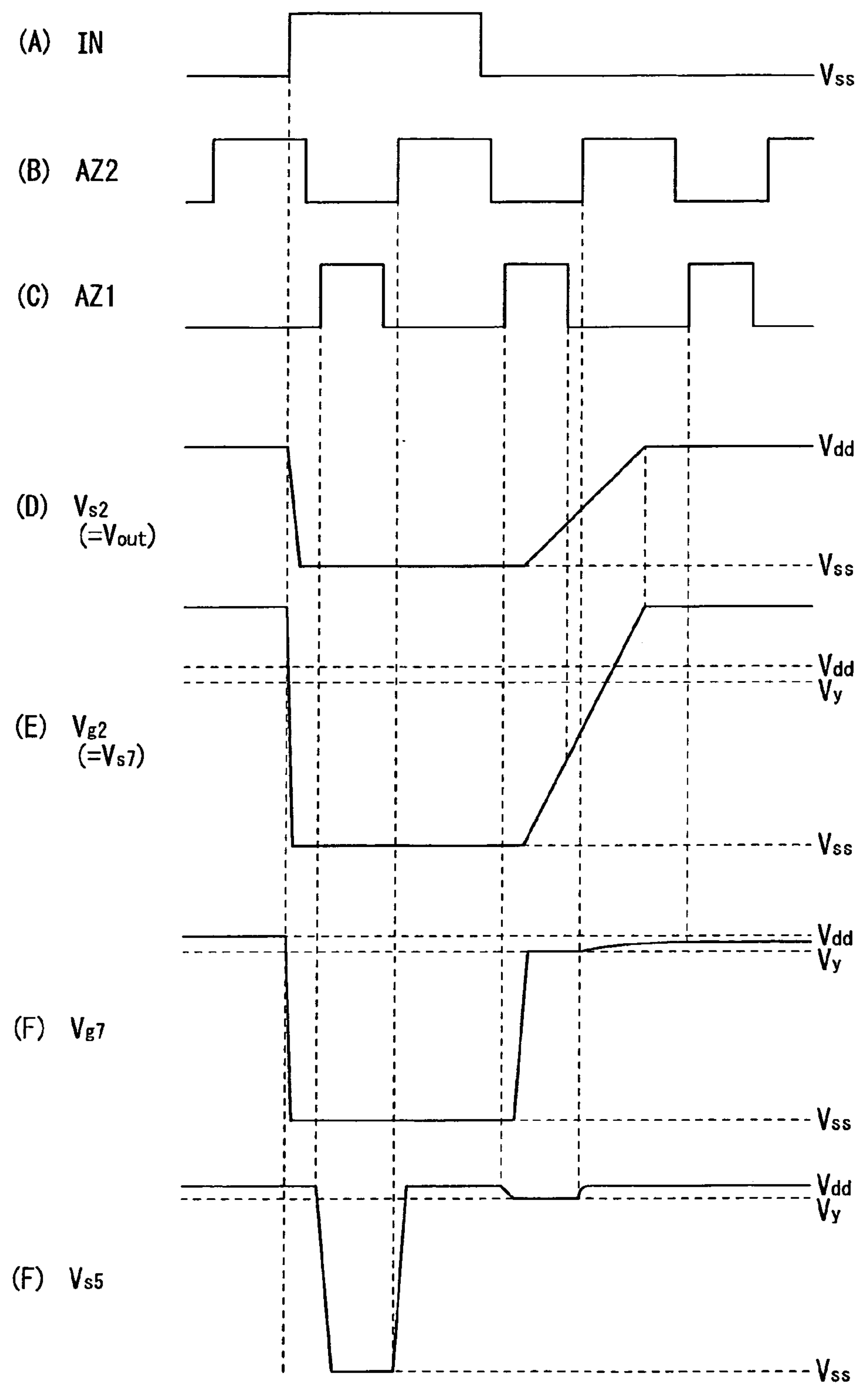
FIG. 12 is a waveform diagram illustrating another example of the operation of the inverter circuit in FIG. 1.
Figure 14:
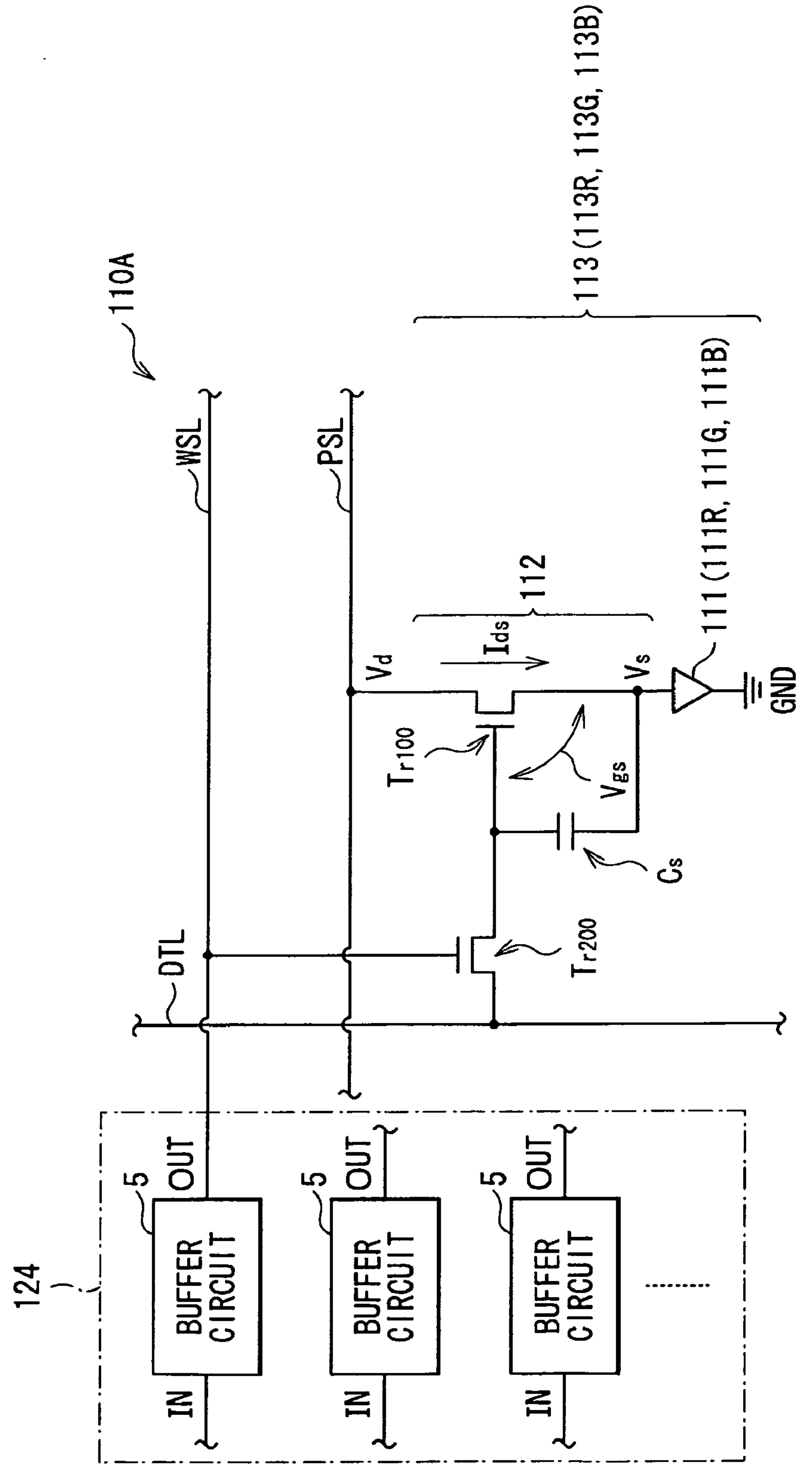
FIG. 14 is a circuit diagram illustrating an example of a write-line driving circuit and an example of a pixel circuit in FIG. 13.

FIG. 14 illustrates an example of a circuit configuration within the display area 110A, together with an example of a write-line driving circuit 124 to be described later. Within the display area 110A, plural pixel circuits 112 respectively paired with the individual organic EL elements 111 are arranged two-dimensionally. In the present application example, a pair of the organic EL element 111 and the pixel circuit 112 configure one pixel 113. To be more specific, as illustrated in FIG. 12, a pair of the organic EL element 111R and the pixel circuit 112 configure one pixel 113R for red, a pair of the organic EL element 111G and the pixel circuit 112 configure one pixel 113G for green, and a pair of the organic EL element 111B and the pixel circuit 112 configure one pixel 113B for blue. Further, the adjacent three pixels 113R, 113G and 113B configure one display pixel 114.

Each of the pixel circuits 112 includes, for example, a drive transistor $Tr_{100}$ that controls a current flowing in the organic EL element 111, a write transistor $Tr_{200}$ that writes a voltage of a signal line DTL into the drive transistor $Tr_{100}$, and a retention capacitor $C_s$, and thus each of the pixel circuits 112 has a 2Tr1C circuit configuration. The drive transistor $Tr_{100}$ and the write transistor $Tr_{200}$ are each formed by, for example, an n-channel MOS Thin Film Transistor (TFT). The drive transistor $Tr_{100}$ or the write transistor $Tr_{200}$ may be, for example, a p-channel MOS TFT.

In the display area 110A, plural write lines WSL (scanning line) are arranged in rows and plural signal lines DTL are arranged in columns. In the display area 110A, further, plural power-source lines PSL (member to which the source voltage is supplied) are arranged in rows along the write lines WSL. Near a cross-point between each signal line DTL and each write line WSL, one organic EL element 111 is provided. Each of the signal lines DTL is connected to an output end (not illustrated) of a signal-line driving circuit 123 to be described later, and to either of the drain electrode and the source electrode (not illustrated) of the write transistor $Tr_{200}$. Each of the write lines WSL is connected to an output end (not illustrated) of the write-line driving circuit 124 to be described later and to the gate electrode (not illustrated) of the write transistor $Tr_{200}$. Each of the power-source lines PSL is connected to an output end (not illustrated) of a power-source-line driving circuit 125 to be described later, and to either of the drain electrode and the source electrode (not illustrated) of the drive transistor $Tr_{100}$. Of the drain electrode and the source electrode of the write transistor $Tr_{200}$, one (not illustrated) that is not connected to the signal line DTL is connected to the gate electrode (not illustrated) of the drive transistor $Tr_{100}$ and one end of the retention capacitor $C_s$. Of the drain electrode and the source electrode of the drive transistor $Tr_{100}$, one (not illustrated) that is not connected to the power-source line PSL and the other end of the retention capacitor $C_s$ are connected to an anode electrode (not illustrated) of the organic EL element 111. A cathode electrode (not illustrated) of the organic EL element 111 is connected to, for example, a ground line GND.

(Drive Circuit 120)

Next, each circuit within the drive circuit 120 will be described with reference to FIG. 13 and FIG. 14. The drive circuit 120 includes a timing generation circuit 121, a video signal processing circuit 122, the signal-line driving circuit 123, the write-line driving circuit 124 and the power-source-line driving circuit 125.

The timing generation circuit 121 performs control so that the video signal processing circuit 122, the signal-line driving circuit 123, the write-line driving circuit 124 and the power-source-line driving circuit 125 operate in an interlocking manner. For example, the timing generation circuit 121 is configured to output a control signal 121A to each of the above-described circuits, according to (in synchronization with) a synchronization signal 120B input externally.

The video signal processing circuit 122 makes a predetermined correction to a video signal 120A input externally, and outputs to the signal-line driving circuit 123 a video signal 122A after the correction. As the predetermined correction, there are, for example, a gamma correction and an overdrive correction.

The signal-line driving circuit 123 applies, according to (in synchronization with) the input of the control signal 121A, the video signal 122A (signal voltage $V_{sig}$) input from the video signal processing circuit 122, to each of the signal lines DTL, thereby performing writing into the pixel 113 targeted for selection. Incidentally, the writing refers to the application of a predetermined voltage to the gate of the drive transistor $Tr_{100}$.

The signal-line driving circuit 123 is configured to include, for example, a shift resistor (not illustrated), and includes a buffer circuit (not illustrated) for each stage, corresponding to each column of the pixels 113. This signal-line driving circuit 123 is able to output two kinds of voltages ($V_{ofs}$, $V_{sig}$) to each of the signal lines DTL, according to (in synchronization with) the input of the control signal 121A. Specifically, the signal-line driving circuit 123 supplies, via the signal line DTL connected to each of the pixels 113, the two kinds of voltages ($V_{ofs}$, $V_{sig}$) sequentially to the pixel 113 selected by the write-line driving circuit 124.

Here, the offset voltage $V_{ofs}$ is a constant value without relying on the signal voltage $V_{sig}$. Further, the signal voltage $V_{sig}$ is a value corresponding to the video signal 122A. A minimum voltage of the signal voltage $V_{sig}$ is a value lower than the offset voltage $V_{ofs}$, and a maximum voltage of the signal voltage $V_{sig}$ is a value higher than the offset voltage $V_{ofs}$.

The write-line driving circuit 124 is configured to include, for example, a shift resistor (not illustrated), and includes a buffer circuit 5 for each stage, corresponding to each row of the pixels 113. The buffer circuit 5 is configured to include plural inverter circuits 1 described above, and outputs, from an output end, a pulse signal approximately in the same phase as a pulse signal input into an input end. The write-line driving circuit 124 outputs two kinds of voltages ($V_{dd}$, $V_{ss}$) to each of the write lines WSL, according to (in synchronization with) the input of the control signal 121A. Specifically, the write-line driving circuit 124 supplies, via the write line WSL connected to each of the pixels 113, the two kinds of voltages ($V_{dd}$, $V_{ss}$) to the pixel 113 targeted for driving, and thereby controls the write transistor $Tr_{200}$.

Here, the voltage $V_{dd}$ is a value equal to or higher than an on-voltage of the write transistor $Tr_{200}$. $V_{dd}$ is the value of a voltage output from the write-line driving circuit 124 at the time of extinction or at the time of a threshold correction to be described later. $V_{ss}$ is a value lower than the on-voltage of the write transistor $Tr_{200}$, and also lower than $V_{dd}$.

The power-source-line driving circuit 125 is configured to include, for example, a shift resistor (not illustrated), and includes, for example, a buffer circuit (not illustrated) for each stage, corresponding to each row of the pixels 113. This power-source-line driving circuit 125 outputs two kinds of voltages ($V_{ccH}$, $V_{ccL}$) according to (in synchronization with) the input of the control signal 121A. Specifically, the power-source-line driving circuit 125 supplies, via the power-source line PSL connected to each of the pixels 113, the two kinds of voltages ($V_{ccH}$, $V_{ccL}$) to the pixel 113 targeted for driving, and thereby controls the light emission and extinction of the organic EL element 111.

Here, the voltage $V_{ccL}$ is a value lower than a voltage ($V_{c1}+V_{ca}$) that is the sum of a threshold voltage $V_{c1}$ of the organic EL element 111 and a voltage $V_{ca}$ of the cathode of the organic EL element 111. Further, the voltage $V_{ccH}$ is a value equal to or higher than the voltage ($V_{c1}+V_{ca}$).

Next, an example of the operation (operation from extinction to light emission) of the display device 100 according to the present application example will be described. In the present application example, in order that even when the threshold voltage $V_{th}$ and the mobility μ of the drive transistor $Tr_{100}$ change over time, light emission luminance of the organic EL element 111 remains constant without being affected by these changes, correction operation for the change of the threshold voltage $V_{th}$ and the mobility μ is incorporated.

Figure 15:
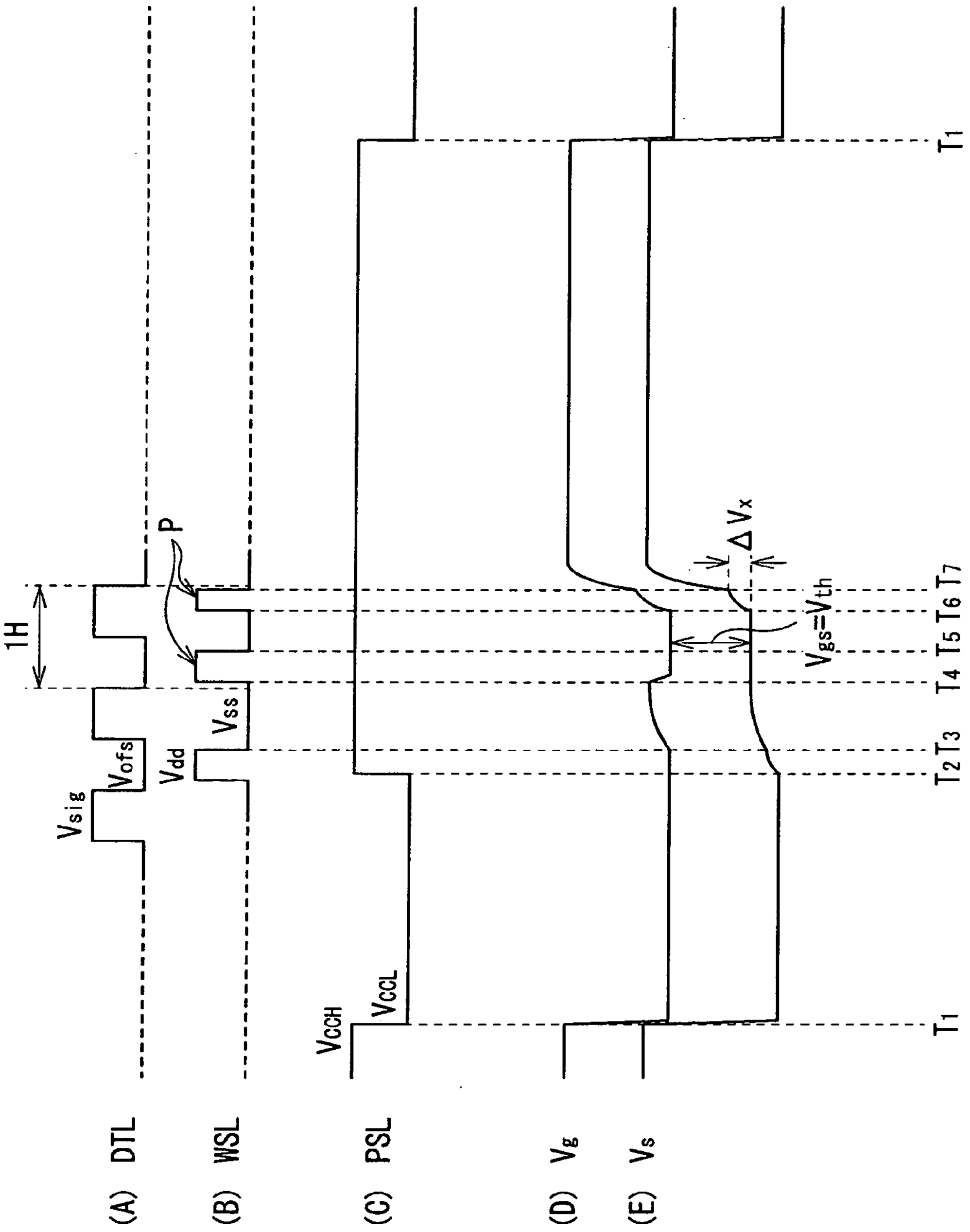
FIG. 15 is a waveform diagram illustrating an example of the operation of the display device in FIG. 13.
Figure 16:
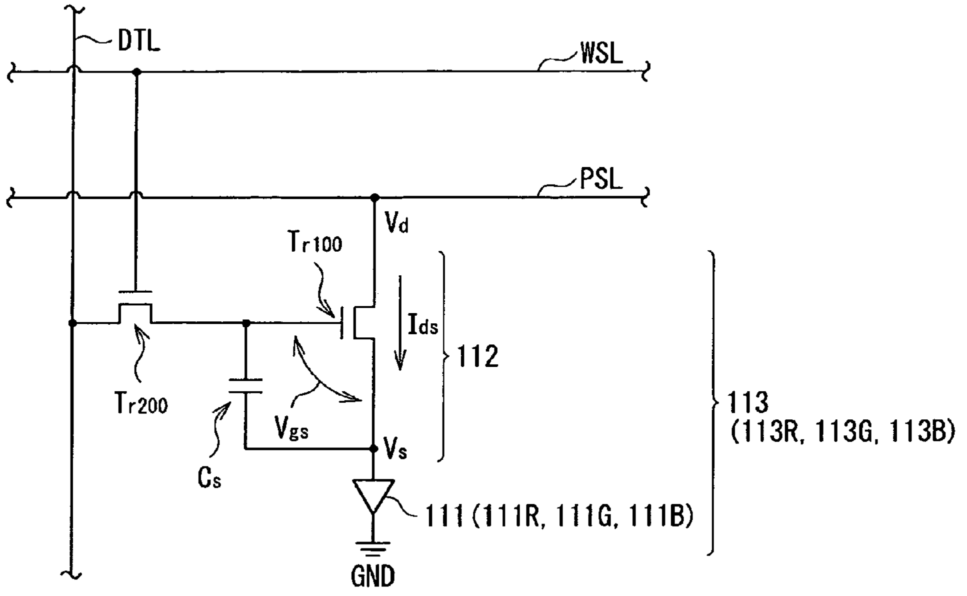
FIG. 16 RELATED ART
FIG. 16 is a circuit diagram illustrating an example of a pixel circuit in a display device in related art.

FIG. 15 illustrates an example of the waveform of a voltage applied to the pixel circuit 112 and an example of the change in each of the gate voltage $V_g$ and the source voltage $V_s$ of the drive transistor $Tr_{100}$. In Part (A) of FIG. 15, there is illustrated a state in which the signal voltage $V_{sig}$ and the offset voltage $V_{ofs}$ are applied to the signal line DTL. In Part (B) of FIG. 15, there is illustrated a state in which the voltage $V_{dd}$ for turning on the write transistor $Tr_{200}$ and the voltage $V_{ss}$ for turning off the write transistor $Tr_{200}$ are applied to the write line WSL. In Part (C) of FIG. 15, there is illustrated a state in which the voltage $V_{ccH}$ and the voltage $V_{ccL}$ are applied to the power-source line PSL. Further, in Part (D) and Part (E) of FIG. 15, there is illustrated a state in which the gate voltage $V_g$ and the source voltage $V_s$ of the drive transistor $Tr_{100}$ change over time in response to the application of the voltages to the power-source line PSL, the signal line DTL and the write line WSL.

($V_{th}$ Correction Preparation Period)

First, a Preparation for the $V_{th}$ Correction is Made. Specifically, when the voltage of the write line WSL is $V_{off}$, and the voltage of the power-source line PSL is $V_{ccH}$ (in other words, when the organic EL element 111 is emitting light), the power-source-line driving circuit 125 reduces the voltage of the power-source line PSL from $V_{ccH}$ to $V_{ccL}$ ($T_1$). Then, the source voltage $V_s$ becomes $V_{ccL}$, and the organic EL element 111 stops emitting the light. Subsequently, when the voltage of the signal line DTL is $V_{ofs}$, the write-line driving circuit 124 increases the voltage of the write line WSL from $V_{off}$ to $V_{on}$, so that the gate of the drive transistor $Tr_{100}$ becomes $V_{ofs}$.

(First $V_{th}$ Correction Period)

Next, the correction of $V_{th}$ is performed. Specifically, while the write transistor $Tr_{200}$ is on, and the voltage of the signal line DTL is $V_{ofs}$, the power-source-line driving circuit 125 increases the voltage of the power-source line PSL from $V_{ccL}$ to $V_{ccH}$ ($T_2$). Then, a current $I_{ds}$ flows between the drain and the source of the drive transistor $Tr_{100}$, and the source voltage $V_s$ rises. Subsequently, before the signal-line driving circuit 123 switches the voltage of the signal line DTL from $V_{ofs}$ to $V_{sig}$, the write-line driving circuit 124 reduces the voltage of the write line WSL from $V_{on}$ to $V_{off}$($T_3$). Then, the gate of the drive transistor $Tr_{100}$ enters a floating state, and the correction of $V_{th}$ stops.

(First $V_{th}$ Correction Stop Period)

In a period during which the $V_{th}$ correction is stopped, in, for example, other row (pixel) different from the row (pixel) to which the previous correction is made, the voltage of the signal line DTL is sampled. At the time, in the row (pixel) to which the previous correction is made, the source voltage $V_s$ is lower than $V_{ofs}-V_{th}$. Therefore, during the $V_{th}$ correction stop period, in the row (pixel) to which the previous correction is made, the current $I_{ds}$ flows between the drain and the source of the drive transistor $Tr_{100}$, the source voltage $V_s$ rises, and the gate voltage $V_g$ also rises due to coupling via the retention capacitor $C_s$, as well.

(Second $V_{th}$ Correction Period)

Next, the $V_{th}$ correction is made again. Specifically, when the voltage of the signal line DTL is $V_{ofs}$ and the $V_{th}$ correction is possible, the write-line driving circuit 124 increases the voltage of the write line WSL from $V_{off}$ to $V_{on}$, thereby causing the gate of the drive transistor $Tr_{100}$ to be $V_{ofs}$ ($T_4$). At the time, when the source voltage $V_s$ is lower than $V_{ofs}-V_{th}$ (when the $V_{th}$ correction is not completed yet), the current $I_{ds}$ flows between the drain and the source of the drive transistor $Tr_{100}$, until the drive transistor $Tr_{100}$ is cut off (until a between-gate-and-source voltage $V_{gs}$ becomes $V_{th}$). Subsequently, before the signal-line driving circuit 123 switches the voltage of the signal line DTL from $V_{ofs}$ to $V_{sig}$, the write-line driving circuit 124 reduces the voltage of the write line WSL from $V_{on}$ to $V_{off}$ ($T_5$). Then, the gate of the drive transistor $Tr_{100}$ enters a floating state and thus, it is possible to keep the between-gate-and-source voltage $V_{gs}$ constant, regardless of the magnitude of the voltage of the signal line DTL.

Incidentally, during this $V_{th}$ correction period, when the retention capacitor $C_s$ is charged to $V_{th}$, and the between-gate-and-source voltage $V_{gs}$ becomes $V_{th}$, the drive circuit 120 finishes the $V_{th}$ correction. However, when the between-gate-and-source voltage $V_{gs}$ does not reach $V_{th}$, the drive circuit 120 repeats the $V_{th}$ correction and the $V_{th}$ correction stop, until the between-gate-and-source voltage $V_{gs}$ reaches $V_{th}$.

(Writing and μ Correction Period)

After the $V_{th}$ correction stop period ends, the writing and the μ correction are performed. Specifically, while the voltage of the signal line DTL is $V_{sig}$, the write-line driving circuit 124 increases the voltage of the write line WSL from $V_{off}$ to $V_{on}$ ($T_6$), and connects the gate of the drive transistor $Tr_{100}$ to the signal line DTL. Then, the gate voltage $V_g$ of the drive transistor $Tr_{100}$ becomes the voltage $V_{sig}$ of the signal line DTL. At the time, an anode voltage of the organic EL element 111 is still smaller than the threshold voltage $V_{e1}$ of the organic EL element 111 at this stage, and the organic EL element 111 is cut off. Therefore, the current $I_{ds}$ flows in an element capacitance (not illustrated) of the organic EL element 111 and thereby the element capacitance is charged and thus, the source voltage $V_s$ rises by $\Delta V_y$, and the between-gate-and-source voltage $V_g$, soon becomes $V_{sig}+V_{th}-\Delta V_y$. In this way, the μ correction is performed concurrently with the writing. Here, the larger the mobility μ of the drive transistor $Tr_{100}$ is, the larger $\Delta V_y$ is. Therefore, by reducing the between-gate-and-source voltage $V_g$, by $\Delta V_y$ before light emission, variations in the mobility μ among the pixels 113 are removed.

(Light Emission Period)

Lastly, the write-line driving circuit 124 reduces the voltage of the write line WSL from $V_{on}$ to $V_{off}$($T_7$). Then, the gate of the drive transistor $Tr_{100}$ enters a floating state, the current $I_{ds}$ flows between the drain and the source of the drive transistor $Tr_{100}$, and the source voltage $V_s$ rises. As a result, a voltage equal to or higher than the threshold voltage $V_{e1}$ is applied to the organic EL element 111, and the organic EL element 111 emits light of desired luminance.

In the display device 100 of the present application example, as described above, the pixel circuit 112 is subjected to on-off control in each pixel 113, and the driving current is fed into the organic EL element 111 of each pixel 113, so that holes and electrons recombine and thereby emission of light occurs, and this light is extracted to the outside. As a result, an image is displayed in the display area 110A of the display panel 110.

Incidentally, in the present application example, for example, the buffer circuit 5 in the write-line driving circuit 124 is configured to include the plural inverter circuits 1. Therefore, there is almost no through current that flows in the buffer circuit 5 and thus, the power consumption of the buffer circuit 5 may be suppressed. In addition, since there are few variations in the output voltages of the buffer circuits 5, it is possible to reduce the variations among the pixel circuits 112, in terms of the threshold correction and the mobility correction of the drive transistor $Tr_{100}$ within the pixel circuit 112, and moreover, variations in luminance among the pixels 113 may be reduced.

Further, in the inverter circuit 1, only a single voltage line is provided on each of the low voltage side and the high voltage side and thus, there is no need to increase the withstand voltage of the inverter circuit 1 and also, it is possible to minimize an occupied area and thus, a narrower frame is realized.

The present invention has been described by using the embodiment, the modifications and the application example, but the present invention is not limited to the embodiment and like and may be variously modified.

For example, in the embodiment and the modifications described above, only a single voltage line is provided on each of the low voltage side and the high voltage side. However, for example, a voltage line connected to at least one of plural transistors on the high voltage side and a voltage line connected to other transistors on the high voltage side may not be a common line. Similarly, for example, a voltage line connected to at least one of plural transistors on the low voltage side and a voltage line connected to other transistors on the low voltage side may not be a common line.

For example, in the above-described application example, the inverter circuit 1 according to the above-described embodiment is used in the output stage of the write-line driving circuit 124. However, this inverter circuit 1 may be used in an output stage of the power-source-line driving circuit 125, instead of being used in the output stage of the write-line driving circuit 124, or may be used in the output stage of the power-source-line driving circuit 125 in conjunction with the output stage of the write-line driving circuit 124.

The present application contains subject matter related to that disclosed in Japanese Priority Patent Application JP 2010-085492 filed in the Japan Patent Office on Apr. 1, 2010, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An inverter circuit comprising:

a first transistor, a second transistor, a third transistor, a fourth transistor, a fifth transistor, a sixth transistor and a seventh transistor each having channels of same conduction type;

a first capacitive element; and an input terminal and an output terminal, wherein the first transistor makes or breaks electric connection between the output terminal and a first voltage line, in response to a potential difference between a voltage of the input terminal and a voltage of the first voltage line or a potential difference corresponding thereto, the second transistor makes or breaks electric connection between a second voltage line and the output terminal, in response to a potential difference between a voltage of a first terminal that is a source or a drain of the seventh transistor and a voltage of the output terminal or a potential difference corresponding thereto, the third transistor makes or breaks electric connection between a gate of the seventh transistor and the third voltage line, in response to a potential difference between the voltage of the input terminal and a voltage of a third voltage line or a potential difference corresponding thereto, the fourth transistor makes or breaks electric connection between the first capacitive element and the gate of the seventh transistor, in response to a first control signal inputted into a gate of the fourth transistor, the fifth transistor makes or breaks electric connection between the first capacitive element and a fourth voltage line, in response to a second control signal inputted into a gate of the fifth transistor, the sixth transistor makes or breaks electric connection between the first terminal and the fifth voltage line, in response to a potential difference between the voltage of the input terminal and a voltage of a fifth voltage line or a potential difference corresponding thereto, the seventh transistor makes or breaks electric connection between the first terminal and a sixth voltage line, in response to a potential difference between a gate voltage of the seventh transistor and a gate voltage of the second transistor or a potential difference corresponding thereto, and the first capacitive element is inserted between a drain or a source of the fifth transistor and a seventh voltage line.

2. An inverter circuit comprising:

a first transistor, a second transistor, a third transistor, a fourth transistor, a fifth transistor, a sixth transistor and a seventh transistor each having channels of same conduction type;

a first capacitive element; and an input terminal and an output terminal, wherein a gate of the first transistor is electrically connected to the input terminal, one terminal of a drain and a source of the first transistor is electrically connected to a first voltage line, and the other terminal of the first transistor is electrically connected to the output terminal, one terminal of a drain and a source of the second transistor is electrically connected to a second voltage line, and the other terminal of the second transistor is electrically connected to the output terminal, a gate of the third transistor is electrically connected to the input terminal, one terminal of a drain and a source of the third transistor is electrically connected to a third voltage line, and the other terminal of the third transistor is electrically connected to a gate of the seventh transistor, a gate of the fourth transistor is supplied with a first control signal, and one terminal of a drain and a source of the fourth transistor is electrically connected to the gate of the seventh transistor, a gate of the fifth transistor is supplied with a second control signal, one terminal of a drain and a source of the fifth transistor is electrically connected to a fourth voltage line, and the other terminal of the fifth transistor is electrically connected to the other terminal of the fourth transistor, a gate of the sixth transistor is electrically connected to the input terminal, one terminal of a drain and a source of the sixth transistor is electrically connected to a fifth voltage line, and the other terminal of the sixth transistor is electrically connected to the gate of the second transistor, one terminal of a drain and a source of the seventh transistor is electrically connected to a sixth voltage line, and the other terminal of the seventh transistor is electrically connected to the gate of the second transistor, and the first capacitive element is inserted between the other terminal of the fifth transistor and a seventh voltage line.

3. The inverter circuit according to claim 2, further comprising a second capacitive element inserted between the gate and the source of the second transistor.

4. The inverter circuit according to claim 3, wherein a capacity of the second capacitive element is smaller than a capacity of the first capacitive element.

5. The inverter circuit according to claim 4, wherein the first, third, sixth and seventh voltage lines are maintained at the same potential.

6. The inverter circuit according to claim 5, wherein the second, fourth and fifth voltage lines are connected to a power source that outputs a voltage higher than voltages of the first, third, sixth and the seventh voltage lines.

7. The inverter circuit according to claim 6, wherein the fourth and fifth transistors are turned on and off alternately so as to prevent the fourth and fifth transistors from simultaneously staying in ON-state.

8. The inverter circuit according to claim 7, wherein the fourth transistor is turned on before a voltage of the input terminal falls.

9. The inverter circuit according to claim 7, wherein the fourth transistor is turned on after the voltage of the input terminal falls.

10. A display device having a display section and a drive section, the display section including a plurality of scanning lines arranged in rows, a plurality of signal lines arranged in columns and a plurality of pixels arranged in rows and columns, and the drive section including a plurality of inverter circuits each provided for each of the scanning lines to drive each of the pixels, each of the inverter circuits comprising:

a first transistor, a second transistor, a third transistor, a fourth transistor, a fifth transistor, a sixth transistor and a seventh transistor each having channels of same conduction type;

a first capacitive element; and an input terminal and an output terminal, wherein the first transistor makes or breaks electric connection between the output terminal and a first voltage line, in response to a potential difference between a voltage of the input terminal and a voltage of the first voltage line or a potential difference corresponding thereto, the second transistor makes or breaks electric connection between a second voltage line and the output terminal, in response to a potential difference between a voltage of a first terminal that is a source or a drain of the seventh transistor and a voltage of the output terminal or a potential difference corresponding thereto, the third transistor makes or breaks electric connection between a gate of the seventh transistor and the third voltage line, in response to a potential difference between the voltage of the input terminal and a voltage of a third voltage line or a potential difference corresponding thereto, the fourth transistor makes or breaks electric connection between the first capacitive element and the gate of the seventh transistor, in response to a first control signal inputted into a gate of the fourth transistor, the fifth transistor makes or breaks electric connection between the first capacitive element and a fourth voltage line, in response to a second control signal inputted into a gate of the fifth transistor, the sixth transistor makes or breaks electric connection between the first terminal and the fifth voltage line, in response to a potential difference between the voltage of the input terminal and a voltage of a fifth voltage line or a potential difference corresponding thereto, the seventh transistor makes or breaks electric connection between the first terminal and a sixth voltage line, in response to a potential difference between a gate voltage of the seventh transistor and a gate voltage of the second transistor or a potential difference corresponding thereto, and the first capacitive element is inserted between a drain or a source of the fifth transistor and a seventh voltage line.

11. A display device having a display section and a drive section, the display section including a plurality of scanning lines arranged in rows, a plurality of signal lines arranged in columns and a plurality of pixels arranged in rows and columns, and the drive section including a plurality of inverter circuits each provided for each of the scanning lines to drive each of the pixels, each of the inverter circuits comprising:

a first transistor, a second transistor, a third transistor, a fourth transistor, a fifth transistor, a sixth transistor and a seventh transistor each having channels of same conduction type;

a first capacitive element; and an input terminal and an output terminal, wherein a gate of the first transistor is electrically connected to the input terminal, one terminal of a drain and a source of the first transistor is electrically connected to a first voltage line, and the other terminal of the first transistor is electrically connected to the output terminal, one terminal of a drain and a source of the second transistor is electrically connected to a second voltage line, and the other terminal of the second transistor is electrically connected to the output terminal, a gate of the third transistor is electrically connected to the input terminal, one terminal of a drain and a source of the third transistor is electrically connected to a third voltage line, and the other terminal of the third transistor is electrically connected to a gate of the seventh transistor, a gate of the fourth transistor is supplied with a first control signal, and one terminal of a drain and a source of the fourth transistor is electrically connected to the gate of the seventh transistor, a gate of the fifth transistor is supplied with a second control signal, one terminal of a drain and a source of the fifth transistor is electrically connected to a fourth voltage line, and the other terminal of the fifth transistor is electrically connected to the other terminal of the fourth transistor, a gate of the sixth transistor is electrically connected to the input terminal, one terminal of a drain and a source of the sixth transistor is electrically connected to a fifth voltage line, and the other terminal of the sixth transistor is electrically connected to the gate of the second transistor, one terminal of a drain and a source of the seventh transistor is electrically connected to a sixth voltage line, and the other terminal of the seventh transistor is electrically connected to the gate of the second transistor, and the first capacitive element is inserted between the other terminal of the fifth transistor and a seventh voltage line.

12. An inverter circuit, comprising:

a set of transistors each having channels of same conduction type including a first transistor, a second transistor, a third transistor, a fourth transistor, and a fifth transistor;

a first capacitive element; and an input terminal, wherein the first transistor makes or breaks an electric connection between a gate of the fifth transistor and a first voltage line, in response to a voltage of the input terminal applied to a gate of the first transistor, wherein the second transistor makes or breaks an electric connection between the first capacitive element and the gate of the fifth transistor, in response to a first control signal applied to a gate of the second transistor, wherein the third transistor makes or breaks an electric connection between the first capacitive element and a second voltage line, in response to a second control signal applied to a gate of the third transistor, wherein the fourth transistor makes or breaks an electric connection between a first current terminal of the fifth transistor and the first voltage line, in response to the voltage of the input terminal applied to a gate of the fourth transistor, and wherein the fifth transistor makes or breaks an electric connection between the first terminal of the fifth transistor and a fourth voltage line, in response to a voltage applied to the gate of the fifth transistor.

13. An inverter circuit, comprising:

a set of transistors each having channels of same conduction type including a first transistor, a second transistor, a third transistor, a fourth transistor, and a fifth transistor;

a first capacitive element; and an input terminal, wherein a gate of the first transistor is electrically connected to the input terminal, a first current terminal of the first transistor is electrically connected to a first voltage line, and a second current terminal of the first transistor is electrically connected to a gate of the fifth transistor, wherein a gate of the second transistor is supplied with a first control signal and a first current terminal of the second transistor is electrically connected to the gate of the fifth transistor, wherein a gate of the third transistor is supplied with a second control signal, a first current terminal of the third transistor is electrically connected to a second voltage line, and a second current terminal of the third transistor is electrically connected to a second current terminal of the second transistor, wherein a gate of the fourth transistor is electrically connected to the input terminal, a first current terminal of the fourth transistor is electrically connected to the first voltage line, and a second current terminal of the fourth transistor is electrically connected to a first current terminal of the fifth transistor, and a second current terminal of the fifth transistor is electrically connected to a third voltage line.

* * * * *